(12) United States Patent
Ponoth et al.

(10) Patent No.: US 9,941,271 B2
(45) Date of Patent: Apr. 10, 2018

(54) FIN-SHAPED FIELD EFFECT TRANSISTOR AND CAPACITOR STRUCTURES

(71) Applicant: BROADCOM CORPORATION, Irvine, CA (US)

(72) Inventors: Shom Surendran Ponoth, Newport Beach, CA (US); Changyok Park, Irvine, CA (US); Akira Ito, Irvine, CA (US)

(73) Assignee: AVAGO TECHNOLOGIES GENERAL IP (SINGAPORE) PTE. LTD., Singapore (SG)

( * ) Notice: Subject to any disclaimer, the term of this patent is extended or adjusted under 35 U.S.C. 154(b) by 141 days.

(21) Appl. No.: 14/069,174

(22) Filed: Oct. 31, 2013

(65) Prior Publication Data

US 2015/0097220 A1    Apr. 9, 2015

Related U.S. Application Data

(60) Provisional application No. 61/887,195, filed on Oct. 4, 2013.

(51) Int. Cl.
| | |
|---|---|
| *H01L 27/10* | (2006.01) |
| *H01L 21/70* | (2006.01) |
| *H01L 27/088* | (2006.01) |
| *H01L 27/06* | (2006.01) |

(52) U.S. Cl.
CPC ............................... *H01L 27/0629* (2013.01)

(58) Field of Classification Search
CPC ......... H01L 27/06; H01L 27/09; H01L 21/28; H01L 29/78; H01L 29/06
USPC ........ 257/296, 369, 380, 392, 401, E27.016, 257/E21.004, E27.06, E21.159; 438/382, 438/197, 592
See application file for complete search history.

(56) References Cited

U.S. PATENT DOCUMENTS

| | | | |
|---|---|---|---|
| 6,188,110 B1 * | 2/2001 | Gardner .......... | H01L 21/823807 257/336 |
| 7,646,041 B2 * | 1/2010 | Chae .................... | H01L 27/115 257/204 |
| 2002/0036290 A1 * | 3/2002 | Inaba ................ | H01L 29/42384 257/66 |
| 2004/0108559 A1 * | 6/2004 | Sugii .................. | H01L 29/1054 257/411 |

(Continued)

*Primary Examiner* — Sheikh Maruf
(74) *Attorney, Agent, or Firm* — McDermott Will & Emery LLP

(57) ABSTRACT

A fin-shaped field-effect transistor device is provided. The fin-shaped field effect transistor device may include a semiconductor substrate having a top and a bottom surface. The fin-shaped field effect transistor device may also include a fin structure disposed on the top surface of the semiconductor substrate, where the fin structure includes a first sidewall and a second sidewall opposite of the first sidewall. The first sidewall is adjacent to a first region of the top surface of the semiconductor substrate and the second sidewall is adjacent to a second region of the top surface of the semiconductor substrate. The fin-shaped field effect transistor device may also include an insulation layer disposed above the fin structure and the first and second regions of the top surface. The fin-shaped field effect transistor device may also include a conductor structure disposed above and adjacent to the insulation layer.

20 Claims, 15 Drawing Sheets

(56) References Cited

U.S. PATENT DOCUMENTS

| | | | |
|---|---|---|---|
| 2004/0191994 A1* | 9/2004 | Williams | H01L 27/0255 438/270 |
| 2005/0127420 A1* | 6/2005 | Kito | H01L 27/10861 257/296 |
| 2005/0151206 A1* | 7/2005 | Schwerin | H01L 27/10823 257/390 |
| 2005/0170593 A1* | 8/2005 | Kang | H01L 29/66795 438/296 |
| 2006/0038216 A1* | 2/2006 | Fried | H01L 21/84 257/296 |
| 2006/0113605 A1* | 6/2006 | Currie | H01L 21/823807 257/368 |
| 2007/0069254 A1* | 3/2007 | Cho | H01L 29/66818 257/288 |
| 2007/0080387 A1* | 4/2007 | Liu | H01L 28/82 257/303 |
| 2007/0085127 A1* | 4/2007 | Kang | H01L 29/66818 257/310 |
| 2007/0278578 A1* | 12/2007 | Yoshida | H01L 21/845 257/347 |
| 2008/0149984 A1* | 6/2008 | Chang | H01L 27/108 257/314 |
| 2008/0157162 A1* | 7/2008 | Doyle | H01L 21/84 257/315 |
| 2008/0157208 A1* | 7/2008 | Fischer | H01L 21/76843 257/368 |
| 2008/0283958 A1* | 11/2008 | Ohnuma | H01L 27/1214 257/506 |
| 2008/0290391 A1* | 11/2008 | Hsu | H01L 21/28282 257/315 |
| 2009/0096003 A1* | 4/2009 | Zhu | H01L 27/1082 257/309 |
| 2009/0174001 A1* | 7/2009 | Lee | H01L 21/823431 257/368 |
| 2009/0294800 A1* | 12/2009 | Cheng | H01L 21/823412 257/192 |
| 2010/0002494 A1* | 1/2010 | Xiong | H01L 27/10805 365/149 |
| 2010/0006939 A1* | 1/2010 | Kim | H01L 29/785 257/347 |
| 2010/0038694 A1* | 2/2010 | Anderson | H01L 27/10823 257/303 |
| 2010/0052034 A1* | 3/2010 | Cheng | H01L 29/7881 257/316 |
| 2010/0123203 A1* | 5/2010 | Bhuwalka | H01L 29/7391 257/402 |
| 2010/0155846 A1* | 6/2010 | Mukherjee | H01L 21/28512 257/365 |
| 2010/0171118 A1* | 7/2010 | Saha | H01L 21/84 257/51 |
| 2010/0187594 A1* | 7/2010 | Mizukami | H01L 27/115 257/316 |
| 2010/0207179 A1* | 8/2010 | Booth, Jr. | H01L 21/823431 257/296 |
| 2011/0175152 A1* | 7/2011 | Booth, Jr. | H01L 21/845 257/306 |
| 2011/0233634 A1* | 9/2011 | Cai | H01L 21/84 257/301 |
| 2012/0025316 A1* | 2/2012 | Schultz | H01L 21/845 257/368 |
| 2012/0043597 A1* | 2/2012 | Chen | H01L 21/823412 257/296 |
| 2012/0138953 A1* | 6/2012 | Cai | H01L 21/823807 257/77 |
| 2012/0168832 A1* | 7/2012 | Anderson | H01L 29/0847 257/288 |
| 2012/0273747 A1* | 11/2012 | Saitoh | H01L 21/823431 257/5 |
| 2013/0187228 A1* | 7/2013 | Xie | H01L 29/785 257/347 |
| 2013/0193500 A1* | 8/2013 | Chen | H01L 27/0629 257/296 |
| 2013/0260549 A1* | 10/2013 | Jagannathan | H01L 21/28518 438/592 |
| 2013/0280902 A1* | 10/2013 | Jagannathan | H01L 29/4958 438/595 |
| 2013/0309857 A1* | 11/2013 | Koburger III | H01L 29/401 438/591 |
| 2014/0048881 A1* | 2/2014 | Kanike | H01L 29/66545 257/347 |
| 2014/0054681 A1* | 2/2014 | Masuoka | H01L 29/7827 257/329 |
| 2014/0084381 A1* | 3/2014 | Yeh | H01L 27/0629 257/380 |
| 2014/0097483 A1* | 4/2014 | Wang | H01L 27/1156 257/318 |
| 2014/0103450 A1* | 4/2014 | Cheng | H01L 21/845 257/401 |
| 2014/0264488 A1* | 9/2014 | Fronheiser | H01L 29/66795 257/288 |
| 2015/0041906 A1* | 2/2015 | Kamineni | H01L 21/823821 257/369 |
| 2015/0091100 A1* | 4/2015 | Xie | H01L 21/76224 257/401 |
| 2015/0123214 A1* | 5/2015 | Wei | H01L 29/66795 257/401 |
| 2015/0228654 A1* | 8/2015 | Khakifirooz | H01L 21/845 257/369 |
| 2015/0340491 A1* | 11/2015 | Zang | H01L 29/66545 257/346 |
| 2016/0071928 A1* | 3/2016 | Xie | H01L 29/785 257/401 |

\* cited by examiner

FIN-SHAPED FIELD EFFECT TRANSISTOR AND CAPACITOR STRUCTURES

CROSS-REFERENCE TO RELATED APPLICATIONS

The present application claims the benefit of U.S. Provisional Patent Application No. 61/887,195, entitled "Fin-Shaped Field Effect Transistor and Capacitor Structures", filed on Oct. 4, 2013, which is hereby incorporated by reference in its entirety for all purposes.

TECHNICAL FIELD

The present description relates generally to field effect transistors, and more particularly, but not exclusively, to fin-shaped field effect transistor and capacitor structures.

BACKGROUND

Passive semiconductor devices include capacitors, which may be implemented as metal-oxide-semiconductor (MOS) capacitors formed on a substrate of an integrated circuit chip, or as complementary metal-oxide-semiconductor (CMOS) capacitors. MOS capacitors can be formed on a substrate of an integrated circuit chip by tying the source and drain terminals of metal-oxide-semiconductor field effect transistors (MOSFET). Such a capacitor may generally be designed to have a high capacitance density (e.g., a large amount of capacitance per unit area) and may generally be formed in a straightforward manner as part of a larger MOS or CMOS processing of the chip as a whole. MOS capacitors generally configured with a connection to ground or to a supply voltage.

As semiconductor devices are increasing in layout density, technology scaling has led to development of fin-based, also referred to as fin-shaped, field effect transistor (finFET) structures as an alternative to bulk metal-oxide-semiconductor FET structures for improved scalability. Fin-based manufacturing techniques can be employed to create non-planar structures on a semiconductor substrate (e.g., silicon), which can increase device density since the channel, source, and/or drain can be raised out of the semiconductor substrate in the form of a fin. The finFET utilizes a fin, such as a silicon fin, to wrap the conducting channel, and the fin forms the body of the transistor. In effect, the gate electrode of the transistor straddles or surrounds the fin. During operation, current flows between the source and drain terminals along the gated sidewall surfaces of the fin.

SUMMARY

Devices and methods are provided for fin-shaped field effect transistor and capacitor structures, substantially as illustrated by and/or described in connection with at least one of the figures, as set forth more completely in the claims.

BRIEF DESCRIPTION OF THE DRAWINGS

Certain features of the subject technology are set forth in the appended claims. However, for purpose of explanation, several embodiments of the subject technology are set forth in the following figures.

FIG. 3H illustrates a top-down schematic of a semiconductor device that includes the fin-based field effect transistor device and a cross-sectional view of the semiconductor device along C-C', which is a direction parallel to a fin width, in accordance with one or more implementations.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, it will be clear and apparent to those skilled in the art that the subject technology is not limited to the specific details set forth herein and may be practiced using one or more implementations.

In one or more implementations, the subject disclosure provides a fin-based, also referred to as a fin-shaped, field effect transistor (finFET) device that includes one or more fin structures that facilitate storage of electrical energy. The finFET device provides an increased amount of surface area that contributes to capacitance, which translates into a higher capacitance density. The finFET device can be utilized in applications involving metal-oxide-semiconductor (MOS) capacitors, such as in decoupling capacitors and charge pump related capacitors, among other applications for which structures that facilitate storage of electrical energy can be utilized. Further, finFET devices may be applicable to double-gate transistors, tri-gate transistors, and various other implementations of semiconductor devices with fin structures above a substrate.

Figure 1:
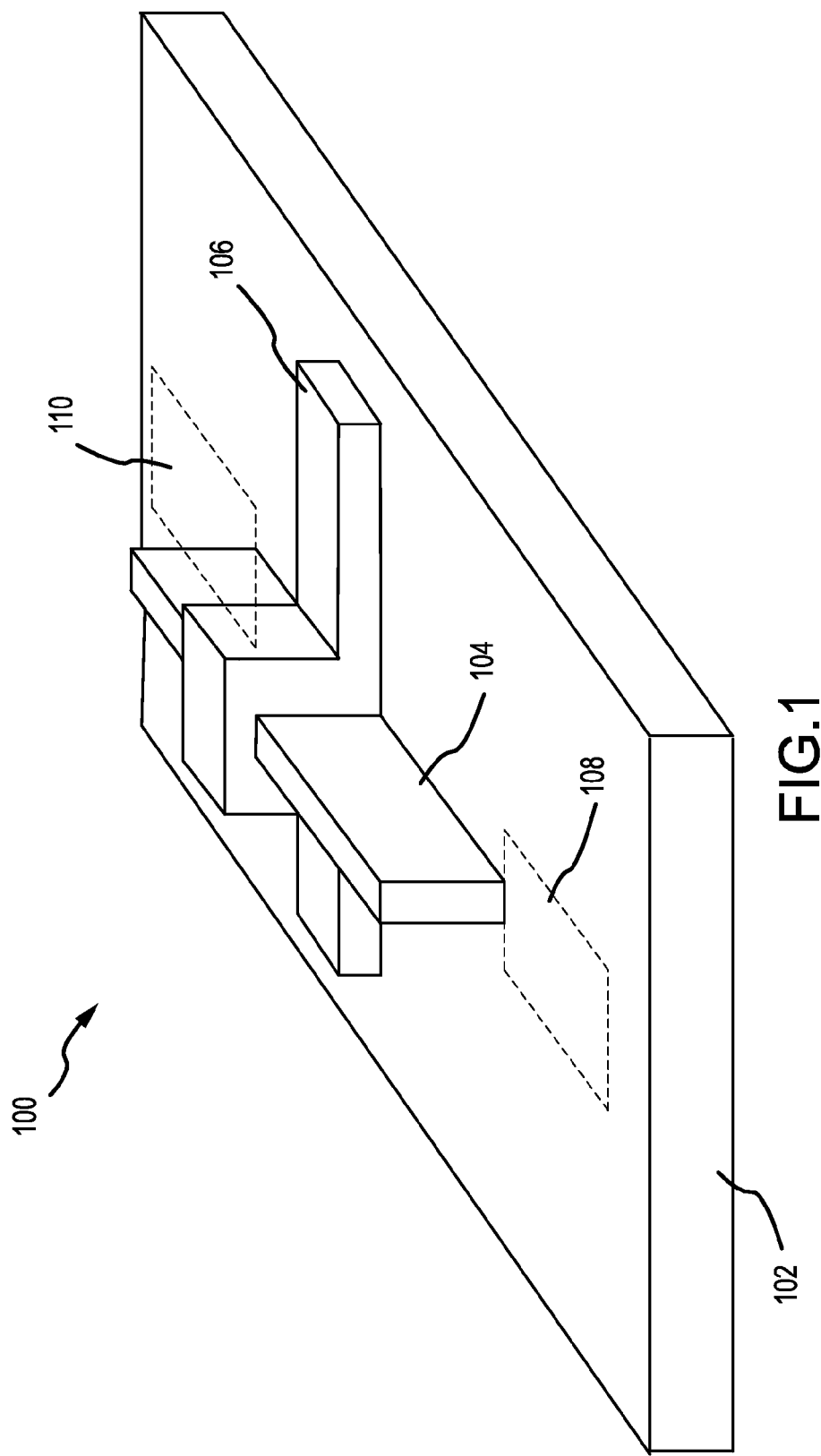
FIG. 1 illustrates a perspective view of a fin-based field effect transistor device in accordance with one or more implementations.

FIG. 1 illustrates a perspective view of a finFET device 100 in accordance with one or more implementations. The finFET device 100 includes a substrate 102 supporting a semiconductor fin 104. A gate structure 106 is deposited over a portion of the semiconductor fin 104 to form a gated channel between a source 108 and a drain 110. In effect, the gate structure 106 straddles or surrounds the semiconductor fin 104. During operation, current flows between the source 108 and the drain 110 along the gated sidewall surfaces of the semiconductor fin 104. Although one semiconductor fin 104 is shown in FIG. 1, in one or more implementations, additional semiconductor fins can be disposed on the substrate 102. In one or more implementations, the gate structure 106 can straddle or surround a plurality of semiconductor fins. In one or more implementations, more than one gate structure can straddle or surround one or more semiconductor fins.

According to one or more implementations, the gate structure 106 is formed using a polysilicon material or a metal. The finFET device 100 may be applicable to various technologies including, but not limited to, complementary metal-oxide-semiconductors (CMOS), silicon (Si), strained silicon, silicon-on-insulator (SOI), gallium-arsenide (GaAs), indium-gallium-arsenide (InGaAs), silicon-germanium (SiGe), and other Group IV elements/compounds and Group III-V compounds. Because the physical depictions in the figures should not be interpreted as limiting, the finFET device 100 may be applicable to double-gate transistors, tri-gate transistors, and various other implementations of semiconductor devices.

The finFET device 100 may be an n-type metal-oxide-semiconductor (NMOS) structure or a p-type metal-oxide-semiconductor (PMOS) structure. The finFET device 100 may include a semiconductor layer (not shown) implanted in the substrate 102. In one or more implementations, the semiconductor layer may include wells and shallow trench isolation (STI) regions. In one or more implementations, the substrate 102 is a p-type substrate made of p-type material. The p-type material may be obtained by a doping process by adding certain types of atoms to the semiconductor (e.g., boron as dopant in silicon substrate) in order to increase the number of positive carriers (holes). Alternatively, the substrate 102 may be an n-type substrate (e.g., arsenic or phosphorus as dopant in silicon substrate).

According to one or more implementations, an integrated circuit is formed using multiple semiconductor fins along an axis that is orthogonal with gate structures (or polysilicon layers) running parallel to one another across the integrated circuit. The intersection of the semiconductor fin 104 and the gate structure 106 over an active material deposited on the substrate 102 forms a transistor. As such, the integrated circuit can be arranged as a grid where multiple grid points represent this intersection. Accordingly, each transistor can be located at a corresponding grid point of the integrated circuit based on the spatial relationship between the semiconductor fin 104 and the gate structure 106. In this respect, the spacing between the multiple semiconductor fins defines a fin pitch. Similarly, the spacing between the gate structures defines a gate pitch. The finFET device 100 is not limited to the implementation shown in FIG. 1 and can be implemented with various configurations and structures.

Figure 2A:
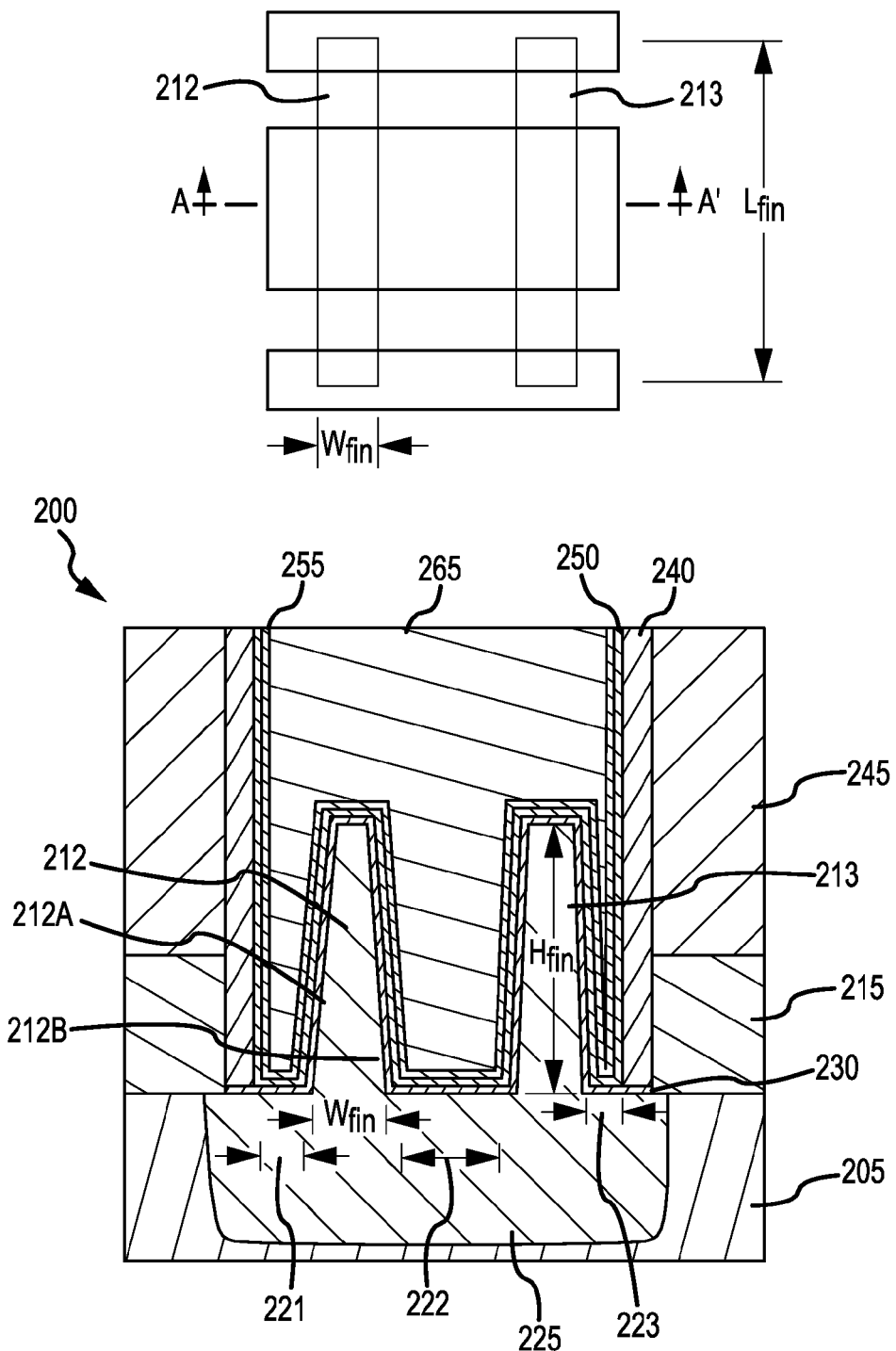
FIG. 2A illustrates a top-down schematic of a semiconductor device that includes a fin-based field effect transistor device and a cross-sectional view of the fin-based field effect transistor device along A-A', which is a direction parallel to a fin width, in accordance with one or more implementations.

FIG. 2A illustrates a top-down schematic of a semiconductor device that includes a finFET device 200 and a cross-sectional view of the finFET device 200 along A-A', which is a direction parallel to a fin width $W_{fin}$, in accordance with one or more implementations. The finFET device 200 includes a semiconductor substrate 205, such as a silicon (Si) substrate, having a top and a bottom surface. One or more fin structures 212-213 can be disposed on the top surface of the semiconductor substrate 205. Each fin structure 212-213 includes a first sidewall 212A and a second sidewall 212B, where the second sidewall 212B is opposite of the first sidewall 212A. The first sidewall 212A of each fin structure 212-213 is adjacent to a region (e.g., 221, 222, or 223) of the top surface of the semiconductor substrate 205 and the second sidewall 212B of the fin structure is adjacent to a region (e.g., 221, 222, or 223) of the top surface of the semiconductor substrate 205.

Fin height $H_{fin}$ can be referred to as a sidewall height and measured from a top surface of the semiconductor substrate 205 to a top of a fin structure. In one or more implementations, the cross-section of the fin is rectangular and the first sidewall height and the second sidewall height of each fin are designed to be similar in value or equal to each other. In one or more implementations, the cross-section of the fin is substantially rectangular, trapezoidal, or other suitable quadrilateral shapes. In one or more implementations, the cross-section of the fin can be triangular. In one or more implementations, the fin structures 212-213 and the regions (e.g., 221, 222, or 223) of the semiconductor substrate 205 adjacent to the fin structures 212-213 are doped to form a doped semiconductor substrate 225.

As shown in FIG. 2A, a layer of oxide material 215 is disposed on some regions of the finFET device 200. An insulation layer (e.g., 230, 250) is disposed above and adjacent to the fin structures 212-213 and regions (e.g., 221, 222, or 223) of the top surface of the semiconductor substrate 205. In one or more implementations, the insulation layer (e.g., 230, 250) includes one or more of a high-k dielectric material 250 and an oxide insulator material 230. A conductor structure (e.g., 255, 265) is formed above and adjacent to the insulation layer (e.g., 230, 250). In one or more implementations, the conductor structure (e.g., 255, 265) includes a work function metal 255 and a gate metal 265. Spacers 240 are disposed for isolation. An insulator structure 245 is disposed over and around the conductor structure (e.g., 255, 265). In one or more implementations, the conductor structure (e.g., 255, 265) includes at least a first sidewall and a second sidewall (e.g., along the fins 212-213 and along the spacers 240), where the insulation layer (e.g., 230, 250) is disposed adjacent to the first sidewall and the second sidewall of the conductor structure (e.g., 255, 265).

In one or more implementations, the finFET device 200 is configured, during operation, to store electrical charge between the conductor structure and the fin structures 212-213 so as to provide capacitance. The finFET device 200 is configured to allow the first and second sidewalls 212A and 212B of the fin structures 212-213 as well as the regions 221, 222, and 223 of the top surface of the semiconductor substrate 205 to contribute to the capacitance of the finFET device 200. With reference to FIG. 2A, a capacitor with a plurality of plates is formed, in one or more implementations, by the conductor structure (e.g., 255, 265) and the doped semiconductor substrate 225, with the insulation layer (e.g., 230, 250) serving as the dielectric or dielectrics between the plates. The finFET device 200 is configured to allow horizontal regions (e.g., in a direction along the direction of fin width $W_{fin}$, such as 221, 222, and 223) adjacent to the fins 212-213 to contribute to the capacitance. In one or more implementations, a region (e.g., 221, 222, or 223) of the top surface of the semiconductor substrate 205 is a portion of the top surface that abuts the insulation layer (e.g., 230, 250), such as the oxide insulator material 230 of the insulation layer (e.g., 230, 250), and that is under the conductor structure (e.g., 255, 265). In one or more implementations, one region (e.g., 221) is separated from another region (e.g., 222) by one or more fin structures (e.g., 212).

Figure 2B:
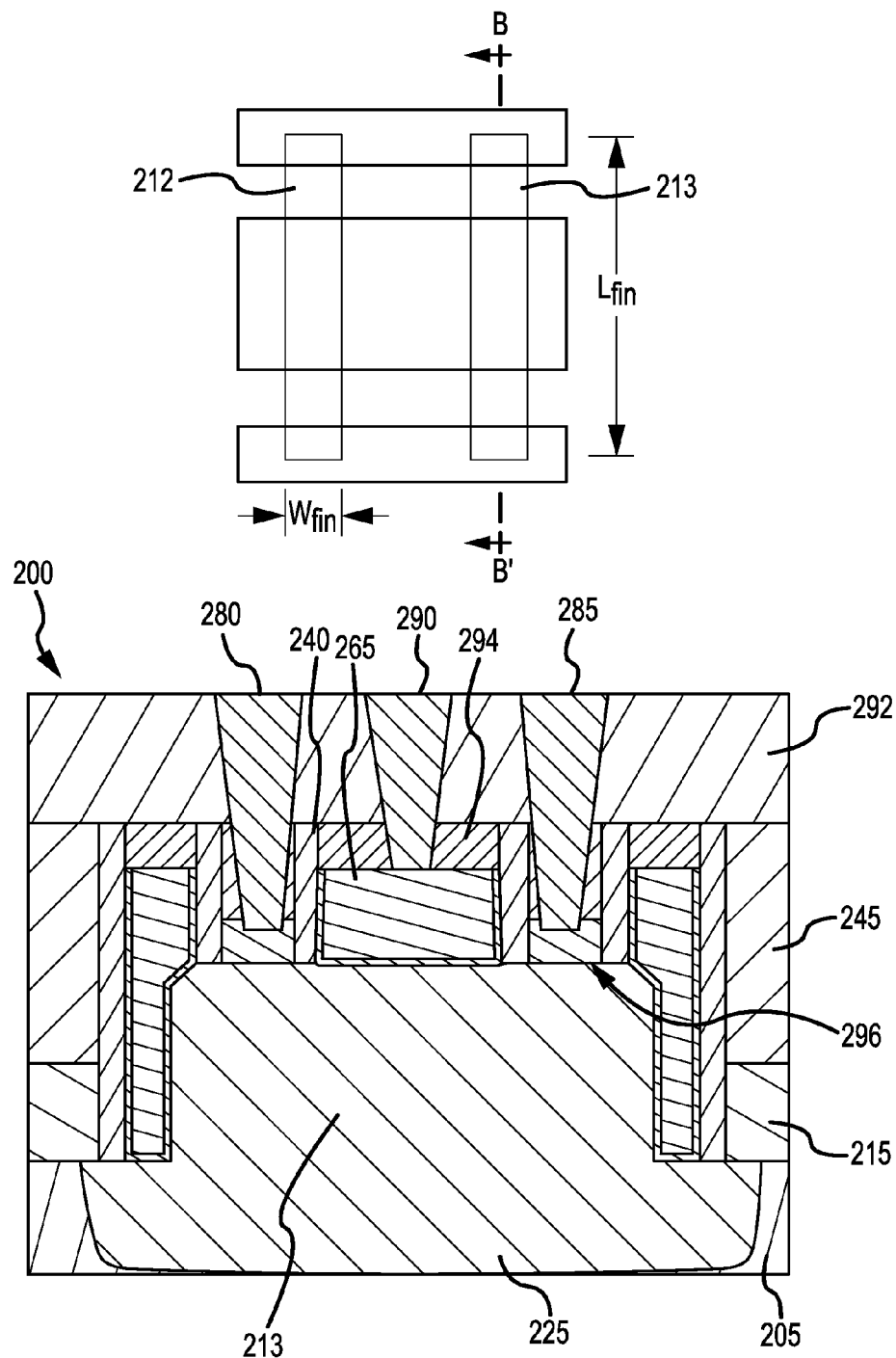
FIG. 2B illustrates a top-down schematic of the semiconductor device that includes the fin-based field effect transistor device and a cross-sectional view of the fin-based field effect transistor device along B-B', which is a direction parallel to a fin length, in accordance with one or more implementations.

FIG. 2B illustrates a top-down schematic of the semiconductor device that includes the finFET device 200 and a cross-sectional view of the finFET device 200 along B-B', which is a direction parallel to a fin length $L_{fin}$, in accordance with one or more implementations. The cross-sectional view shows a source contact 280, a drain contact 285, and a gate contact 290. To utilize the finFET device 200 as a MOS capacitor, the source contact 280 and the drain contact 285 can be tied together. In such a configuration, capacitance is formed with the gate and the connected drain-source as plates. The cross-sectional view also shows dielectric caps 294 that abut spacers 240 and metal (e.g., gate metal 265). The cross-sectional view also shows epitaxy 296.

It is noted that FIG. 2B shows a second insulator structure 292 that is not shown in FIG. 2A. The second insulator structure 292 can begin at around a top-most portion of the spacers 240 and the dielectric caps 294. In one or more implementations, the insulator structure 245 and the second insulator structure 292 are deposited in separate processes. Each of the insulator structures 245 and 292 can be an oxide material (e.g., silicon oxide). In one or more implementations, since the first insulator structure 245 and the second insulator structure 292 are deposited after various junctions are in place, the insulator structures 245 and 292 are generally deposited at lower temperatures relative to previous depositions of oxide materials (e.g., 215). The insulator structures 245 and 292 may have low etch rates (such as low hydrofluoric acid etch rates).

FIGS. 3A-3H illustrate a process for forming the finFET device 200 of FIGS. 2A-2B in accordance with one or more implementations. It is understood to those skilled in the art that specific order or hierarchy of steps in the process disclosed is an illustration of exemplary approaches and that other processes can be realized to form the finFET device 200 of FIGS. 2A-2B in accordance with one or more implementations. Based on preferences and/or specifications (e.g., available resources, performance specifications), it is understood that the specific order or hierarchy of steps in the process may be rearranged or adjusted and that some steps may be removed while others may be added.

Figure 3A:
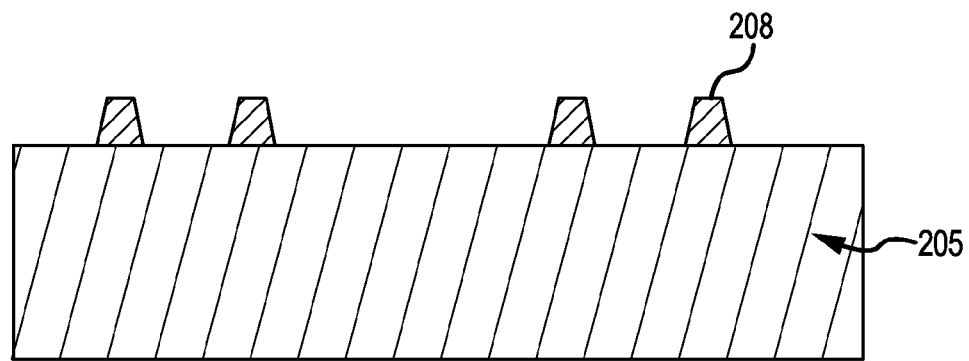
FIGS. 3A-3H illustrate a process for forming the fin-based field effect transistor device of FIGS. 2A-2B in accordance with one or more implementations. In particular.

In FIG. 3A, a hardmask material is deposited and patterned using semiconductor fabrication techniques to form a plurality of hardmask mandrels 208 on the top surface of the semiconductor substrate 205. In one or more implementations, the patterning is performed using sidewall image transfer (SIT). The hardmask material can be, by way of example and not of limitation, oxide (e.g., silicon oxide) or nitride (e.g., silicon nitride).

Figure 3B:
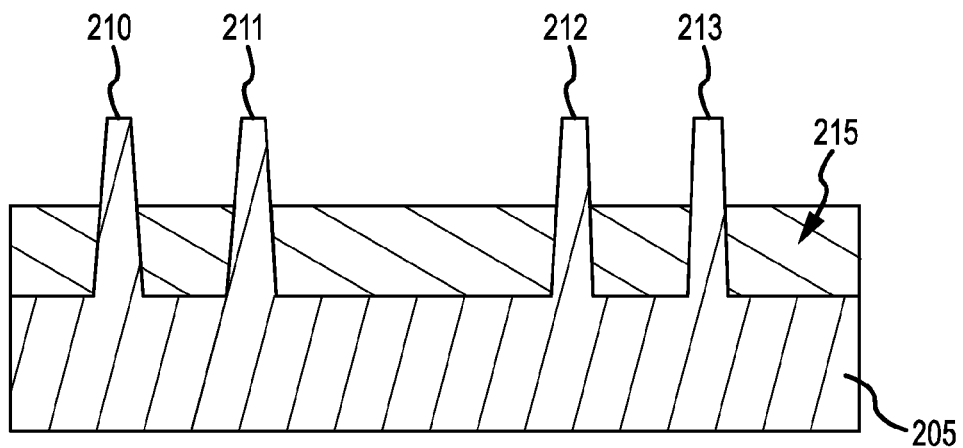

In FIG. 3B, etching is performed on the structure of FIG. 3A to remove regions of the semiconductor substrate 205 based on locations of the hardmask mandrels 208 and thus define a plurality of fins 210-213, after which the hardmask mandrels 208 are removed. A layer of oxide material 215 is deposited on the top surface of the semiconductor substrate 205. In one or more implementations, the oxide material 215 is an oxide suitable for filling the trenches between the fins 210-213. The oxide material 215 may also have a low etch rate (such as a low hydrofluoric acid etch rate). Silicon dioxide ($SiO_2$) is generally used as the oxide material 215, although other suitable oxides can be used. In one or more implementations, the oxide material 215 can be deposited utilizing a process such as a chemical vapor deposition (CVD), low pressure chemical vapor deposition (LPCVD), molecular layer deposition (MLD), among others. In one or more implementations, the layer of oxide material 215 is grown as part of a shallow trench isolation (STI) process. In any implementation, thickness of the oxide material 215 can be between 30 nanometers and 80 nanometers. In one example, the thickness is between 50 nanometers and 60 nanometers.

In one or more implementations, the plurality of fins 210-213, and thus the semiconductor substrate 205 that is etched to define the plurality of fins 210-213, is composed of silicon material. Other materials such as gallium-arsenide, silicon-germanium, among other suitable substrate materials identifiable by a person skilled in the art may also be utilized in the process, in accordance with one or more implementations.

Figure 3C:
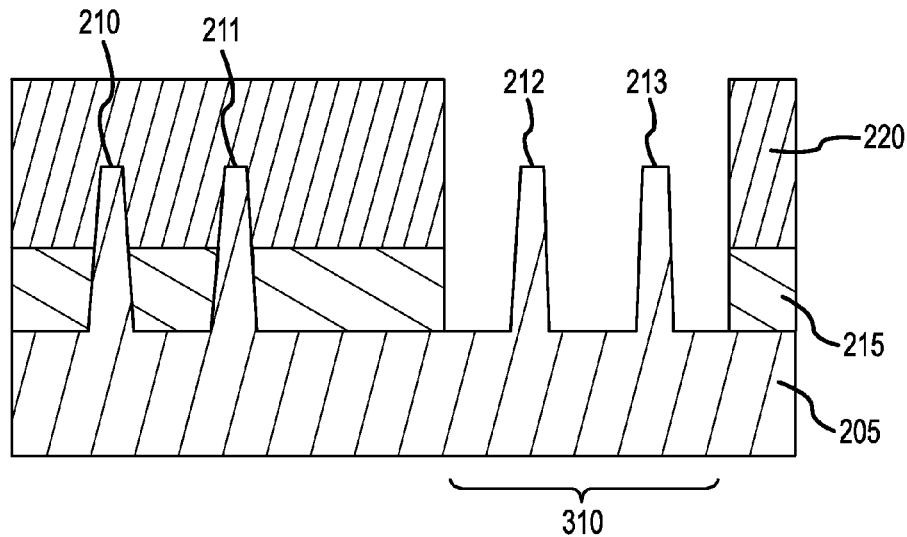

In FIG. 3C, a layer of masking material 220 such as photoresist is deposited and patterned using semiconductor fabrication techniques to define regions protected by the masking material 220 and regions not protected by the masking material 220. The oxide material 215 in region 310 that is not protected by the masking material 220 is then removed (e.g., etched). In one or more implementations, the etching defines passive regions (e.g., regions used to implement passive devices such as capacitors) and non-passive regions or device regions (e.g., regions used to implement transistor devices). In FIG. 3C, region 310 can be a passive region. Subsequent to the removal of the oxide material 215 in region 310, the top surface of the semiconductor substrate 205 and surfaces of the fins 212-213 in region 310 are exposed (e.g., devoid or substantially devoid of an oxide layer disposed on region 310). It is understood that, although the removal of the oxide material 215 should ideally remove the oxide material 215 in the non-protected regions and leave intact the oxide material 215 in protected regions, some residue oxide material may be present in the non-protected areas whereas some oxide material in the protected areas may be removed. Such characteristics can be present in any etching step in a process.

Figure 3D:
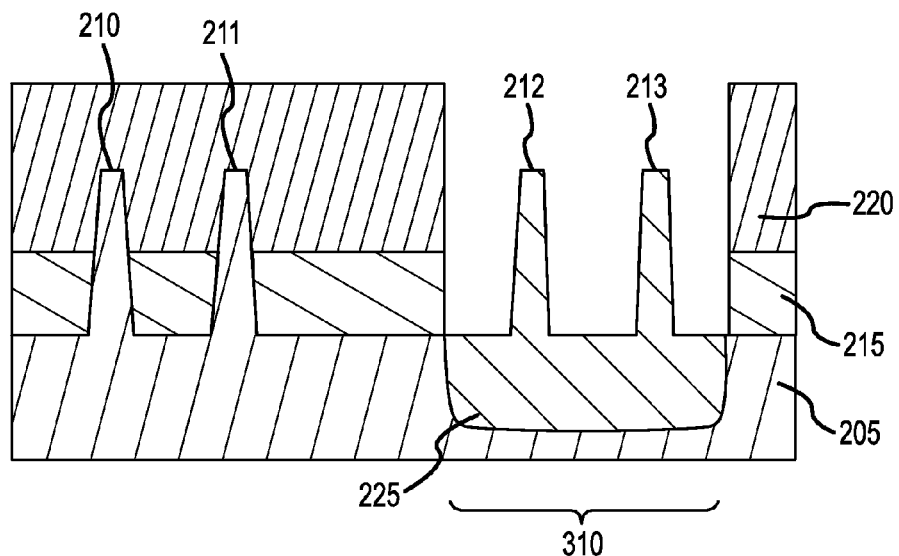

In FIG. 3D, doping is performed to implant dopants into the semiconductor substrate 205 in regions not covered by the masking material 220. Specifically, portions of semiconductor substrate 205 beneath the top surface and the fins 212-213 in region 310 are doped to form a doped semiconductor substrate 225. The doping may be performed using multiple doping processes. The doping can be n-type doping or p-type doping. It is noted that, although not shown in FIG. 3D, doping can also be performed in regions outside of region 310, where the doping can be, but need not be, different from the doping performed in region 310. In one or more implementations, the doping may be performed using ion implantation. In one or more implementations, the doping may utilize an in-situ conformal doping source (e.g., material is doped when grown) such as a doped oxide.

Figure 3E:
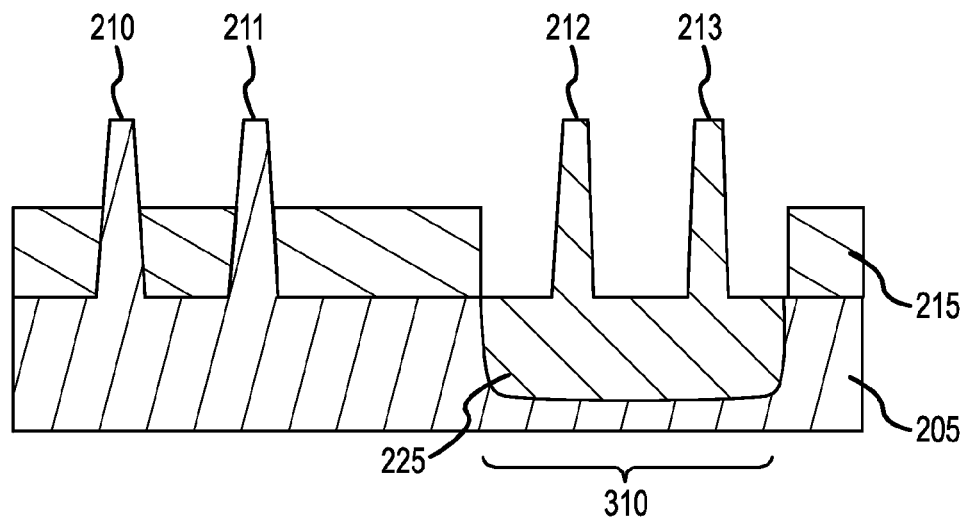
Figure 3F:
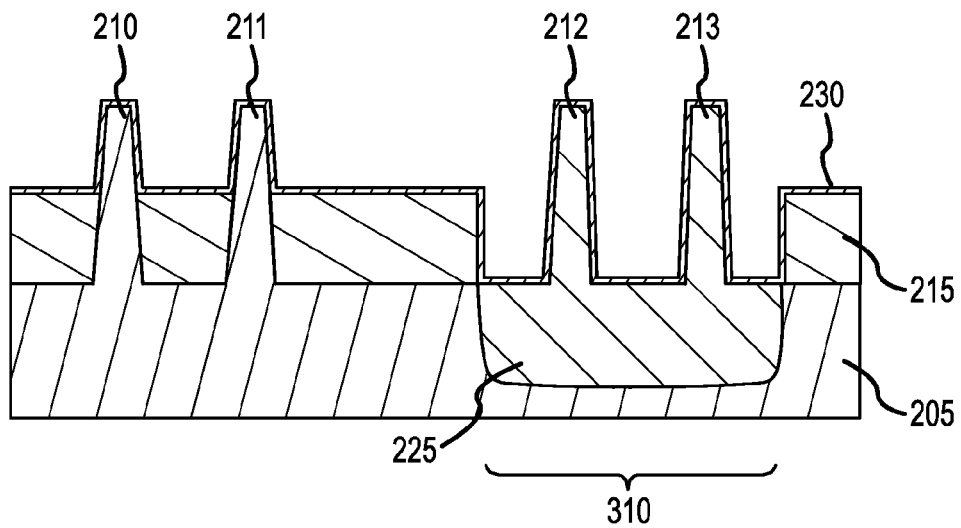

In FIG. 3E, etching is performed on the structure of FIG. 3D to remove the masking material 220. In FIG. 3F, a layer of second oxide material 230 is deposited on the structure of FIG. 3E. In one or more implementations, the second oxide material 230 can be of a different material from the oxide material 215. The second oxide material 230 can be a dielectric material such as silicon dioxide ($SiO_2$). Another example material for the second oxide material 230 is a nitrided silicon oxide (e.g., SiON). Other suitable materials may also be used. In one or more implementations, the second oxide material 230 is disposed as a conformal layer above and adjacent to the fin structures 210-213 and regions of the top surface of the semiconductor substrate 205. The second oxide material 230 can have a thickness in a range between 0.5 and 5.0 nanometers. In one or more implementations, the second oxide material 230 can be deposited utilizing a molecular vapor deposition (MVD) process, although other suitable deposition processes may be utilized.

The second oxide material 230 can be formed using a thick gate oxide (e.g., 3.0 nanometers) corresponding to a high operating voltage process (e.g., 3.6 VDC). Alternatively, the second oxide material 230 can be formed using a thin gate oxide (e.g., 0.5 nanometers) corresponding to a low operating voltage process (e.g., 1.8 VDC). The thin gate oxide can be grown, for example, using thermal oxidation. The thick gate oxide increases the breakdown voltage of the finFET device 200 when compared to the thin gate oxide of the low operating voltage process. In one or more implementations, the second oxide material 230 is disposed above and adjacent to the fin structures 210-213, regions of the top surface of the semiconductor substrate 205, and regions of the oxide material 215.

Figure 3G:
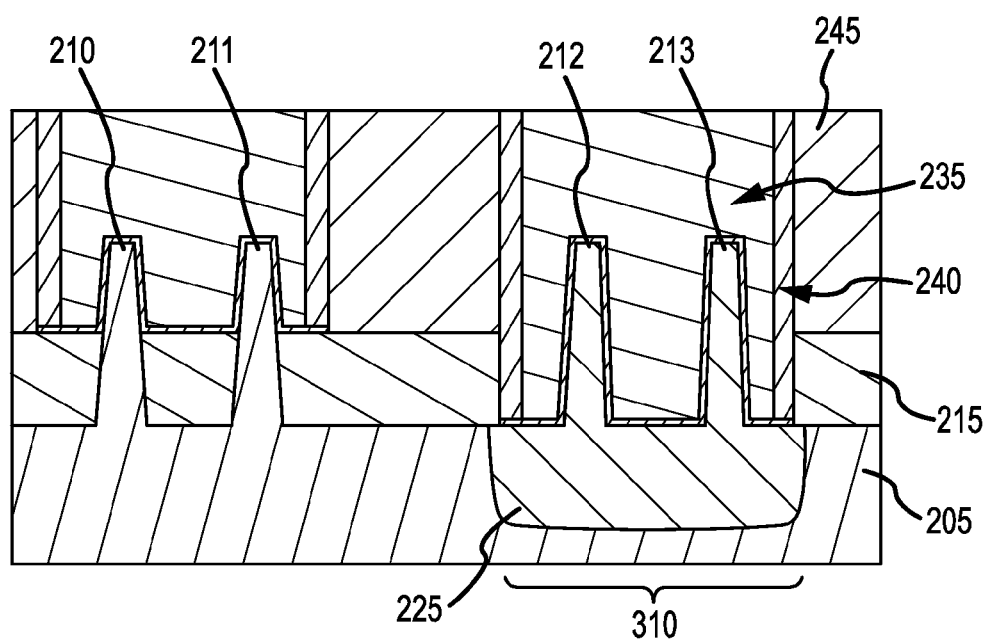

In FIG. 3G, a dummy polysilicon (poly) 235, spacers 240, and an insulator structure 245 are deposited. The insulator structure can be an oxide material (e.g., silicon oxide). In one or more implementations, since the insulator structure 245 is deposited after various junctions are in place, the insulator structure 245 is generally deposited at lower temperatures relative to previous depositions of oxide materials (e.g., 215, 230). The insulator structure 245 may have a low etch rate (such as a low hydrofluoric acid etch rate).

Figure 3H:
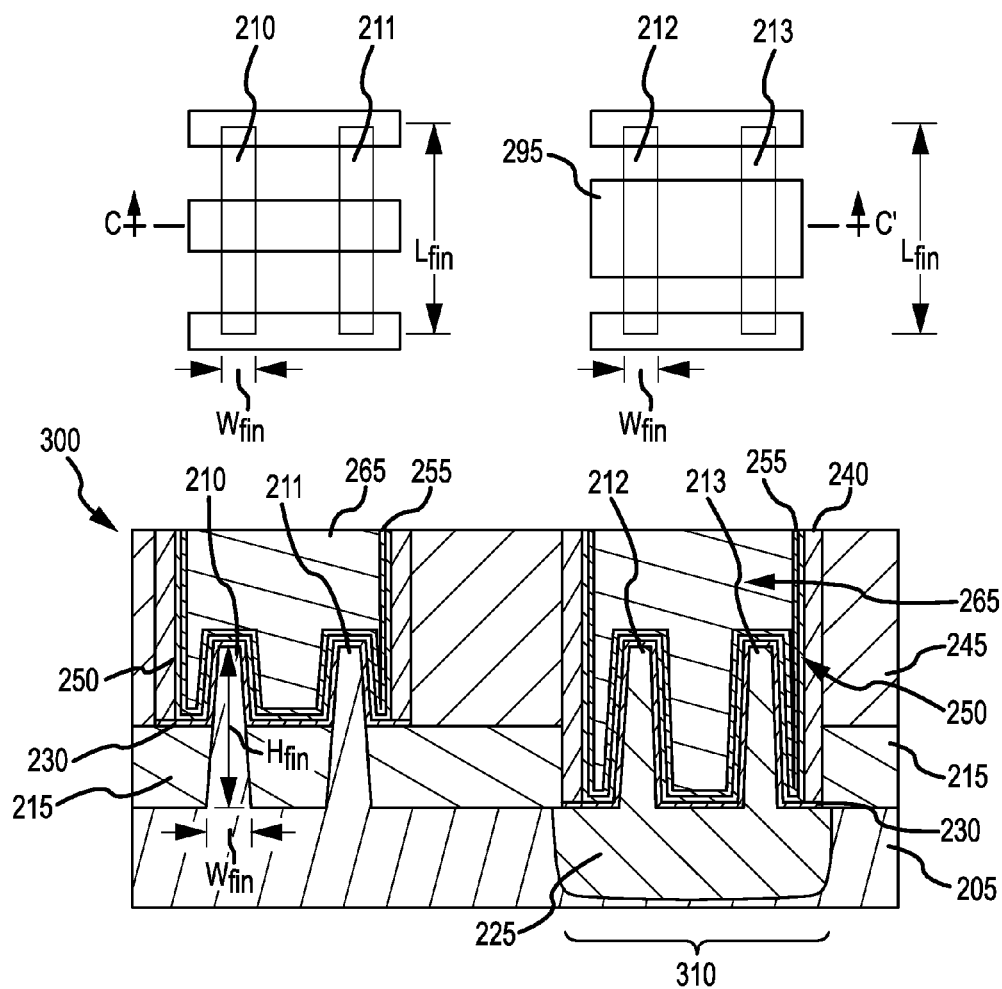

In FIG. 3H, the dummy poly 235 is removed and a dielectric material 250, a work function metal 255, and a gate metal 265 are disposed on the second oxide material 230. In one or more implementations, the dielectric material 250 is thinner than the work function metal 255. Specifically, FIG. 3H illustrates a top-down schematic of a semiconductor device 300, which can itself be considered a finFET device, that includes the finFET device 200 of FIG. 2A and a cross-sectional view of the semiconductor device 300 along C-C', which is a direction parallel to fin width $W_{fin}$, in accordance with one or more implementations. The cross-sectional view of the semiconductor device 300 includes a passive region (e.g., capacitor region) with fins 212-213 and a device region (e.g., transistor region) with fins 210-211 according to one or more implementations. As shown in the top-down schematic in FIG. 3H, a gate 295 associated with a passive region such as region 310 can have a larger gate width (direction along the fin length $L_{fin}$) than gates associated with transistor regions.

The semiconductor device 300 includes the finFET device 200 shown in FIG. 2A, where the semiconductor device 300 is configured to accept metal contacts at source, drain, and gate terminals corresponding to each finFET device that forms the semiconductor device 300. In any implementation, the finFET device 200, shown in FIG. 2A, that forms part of the semiconductor device 300, shown in FIG. 3H, is configured to accept metal contacts at source, drain, and gate terminals of the finFET device 200, as shown in FIG. 2B.

In one or more implementations, the dielectric material 250 is a high-k dielectric material. A higher dielectric constant k allows for a thicker layer of dielectric material 250 to be utilized (e.g., for tunneling considerations). The high-k dielectric material 250 can include, but is not limited to, hafnium oxide, hafnium silicon oxide, lanthanum oxide, lanthanum aluminum oxide, yttrium oxide, lead zinc niobate, among other high-k dielectric materials identifiable by a person skilled in the art. In one or more implementations, the work function metal 255 can include, but is not limited to, titanium carbide, titanium aluminide, tantalum nitride, titanium nitride, tungsten nitride, iridium dioxide, among other metals identifiable by a person skilled in the art. The work function metal 255 can be doped. In one or more implementations, the work function metal 255 can be part of the gate metal 265 and not a separate layer of metal.

In any implementation, the dielectric material 250 can include more than one layer of dielectric material, with each dielectric layer being of a different dielectric from an adjacent dielectric layer. Any dielectric layer can be of a thickness equal to or different from an adjacent dielectric layer. In any implementation, the work function metal 255 can include more than one layer of metal, with each metal layer being of a different metal from an adjacent metal layer. Any metal layer can be of a thickness equal to or different from an adjacent metal layer.

With continued reference to FIG. 3H, a ratio of active sidewall height to full sidewall height in the passive region is higher than the corresponding ratio in the device region. In one or more implementations, the cross-section of the fin is rectangular and the first sidewall height and the second sidewall height of each fin are designed to be similar in value or equal to each other and simply referred to as a single sidewall height. As used herein, the "active sidewall height" or "active fin height" refers to a height of the fin that contributes to capacitance whereas "full sidewall height" or "full fin height", denoted as $H_{fin}$, refers to a physical height of the fin as measured starting from a top surface of a semiconductor substrate to a top of the fin. Consequently, the active sidewall height includes a height along the full sidewall height that contributes to capacitance. The remaining height along the full sidewall height can be referred to as a "non-active sidewall height" or "non-active fin height", which includes a height along the full sidewall height that does not contribute to capacitance or only contributes negligibly to capacitance (e.g., parasitic capacitance). Compared to the device region, portions of the top surface of the semiconductor substrate 205 between the fin structures 212-213 of the capacitor region act as active regions of the semiconductor device 300 of FIG. 3H, and hence increase the amount of surface area that contributes to the capacitance of the capacitor region. For example, the foregoing portions of the top surface of the semiconductor substrate 205 may include regions such as regions 221, 222, and 223 (e.g., labeled in FIG. 2A). In one or more implementations, the non-active sidewall heights of a fin have an associated capacitance density that is less than 1% of an associated capacitance density in the active sidewall heights of the fin.

In accordance with one or more implementations, the insulation layer in the device region includes a layer of the oxide material 215 disposed on and adjacent to portions of the fin structures 210-211, a layer of the oxide material 230 disposed on and adjacent to the layer of oxide material 215 and portions of the fin structures 210-211, and the high-k dielectric material 250 disposed on and adjacent to the layer of the oxide material 230. The conductor structure (e.g., 255, 265), which in one or more implementations includes a work function metal 255 and a gate metal 265, is disposed on and adjacent to the high-k dielectric material 250. In one or more implementations, the layer of the oxide material 215 surrounds the non-active sidewall height of the fins 210-211 and the layer of the oxide material 230 surrounds the active sidewall height of the fins 210-211.

In one or more implementations, the insulation layer (e.g., 230, 250) in the passive region includes a layer of the oxide material 230 and the high-k dielectric material 250 disposed on and adjacent to the layer of the oxide material 230. The conductor structure (e.g., 255, 265), which in one or more implementations includes a work function metal 255 and a gate metal 265, is disposed on the high-k dielectric material 250. In one or more implementations, the layer of oxide material 230 surrounds the active sidewall height of the fins 212-213. In one or more implementations, the insulation layer in the device region is thicker than the insulation layer in the passive region.

As an example, the layer of the oxide material 230 can have a thickness between 0.5 nanometers and 5.0 nanometers. The high-k dielectric material 250 can have a thickness between 1.0 nanometer and 3.0 nanometers. Accordingly, in one or more implementations, thickness of the insulation layer can be between 1.5 nanometers and 8.0 nanometers. In one or more implementations, the insulation layer can include more than one layer of oxide material and/or more than one layer of high-k dielectric material, where thickness of the insulation layer can be between 1.5 nanometers and 8.0 nanometers.

In one or more implementations, the fin structures 210-213 are rectangular with a fin thickness/width of 10 nanometers; a distance (e.g., horizontal distance in FIG. 3H) between adjacent fin structures, referred to as a fin pitch, is 60 nanometers; the active sidewall height and full sidewall height of the fin structures 210-211 are 30 nanometers and 90 nanometers, respectively; and the active sidewall height and full sidewall height of the fin structures 212-213 are both 90 nanometers. In this example, the perimeter for a fin in the device region, formed of the active sidewall heights and the fin thickness/width, is around 70 nanometers whereas the perimeter for a fin in the passive region, formed of the active sidewall heights, the fin thickness/width, and the fin pitch, is around 240 nanometers. Consequently, in one or more implementations, the passive region of the semiconductor device 300 allows for a larger perimeter (and larger surface area) with which to contribute to capacitance. For example, based on these perimeter values and assuming other characteristics are equal, capacitance density of a fin in the passive region can be configured to be over two times higher than capacitance density of a fin in the device region.

In any implementation, fin dimensions (e.g., fin width and/or fin height) and fin spacing between the fin structures need not be the same between any two adjacent or non-adjacent fin structures. In one or more implementations, the full sidewall height of a fin structure can be in a range between 10 nanometers and 90 nanometers. The dimensions provided are examples only and other dimensions can be utilized in accordance with one or more implementations. In any implementation, number of fin structures in each region can be different from each other and can be different from that depicted in the figures.

As previously mentioned, it is understood to those skilled in the art that specific order or hierarchy of steps in the FIGS. 3A-3H is an illustration of exemplary approaches and that other processes can be realized to form the finFET device 200 of FIGS. 2A-2B in accordance with one or more implementations. Based on preferences and/or specifications (e.g., available resources, performance specifications), it is understood that the specific order or hierarchy of steps in the process may be rearranged or adjusted and that some steps may be removed while others may be added. In any implementation, what is shown as one layer of material (e.g., dielectric layer, metal layer, and so forth) may be realized with multiple layers of materials, where each layer may be of a thickness and/or material different from an adjacent layer.

Figure 4:
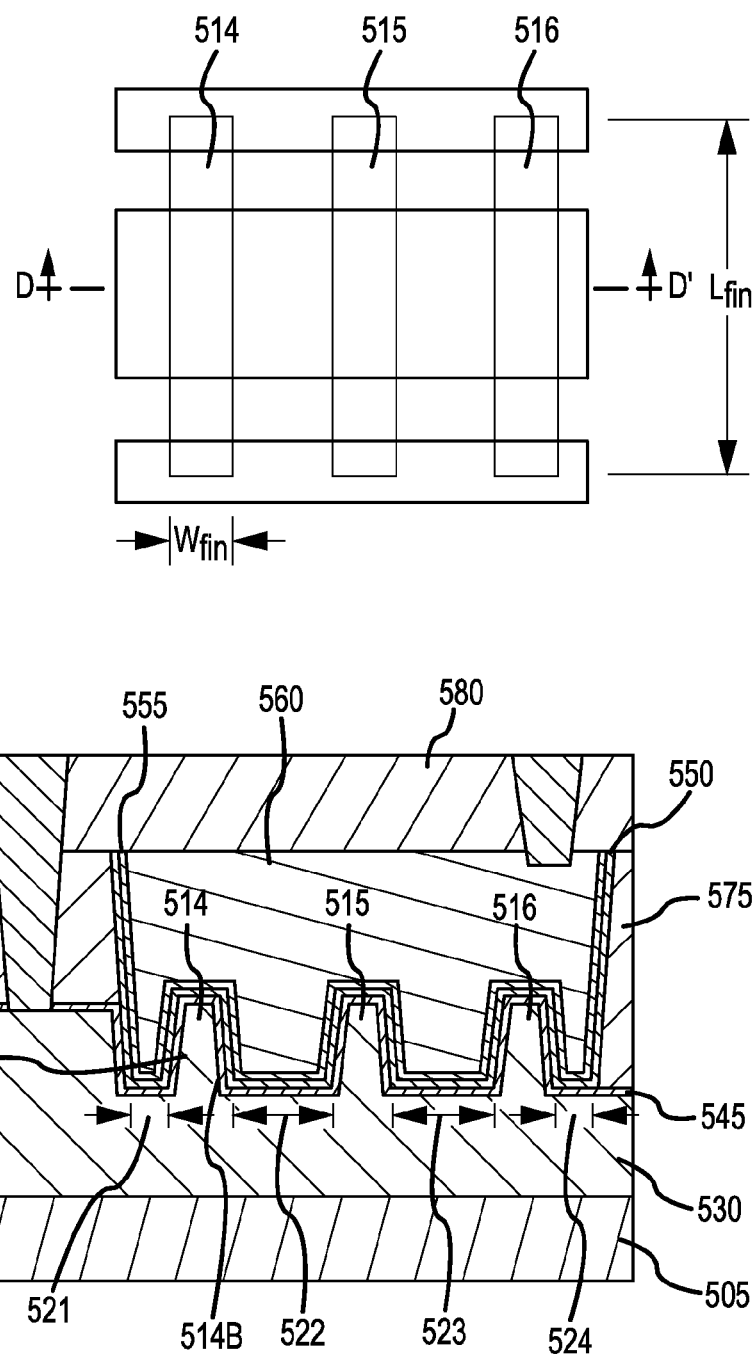
FIG. 4 illustrates a top-down schematic of a semiconductor device that includes a fin-based field effect transistor device and a cross-sectional view of the fin-based field effect transistor device along D-D', which is a direction parallel to a fin width, in accordance with one or more implementations.

FIG. 4 illustrates a top-down schematic of a semiconductor device that includes a finFET device 400 and a cross-sectional view of the finFET device 400 along D-D', which is a direction parallel to fin width $W_{fin}$, in accordance with one or more implementations. The finFET device 400 includes a semiconductor substrate 505, such as a silicon (Si) substrate, having a top and a bottom surface. One or more fin structures 514-516 can be disposed on the top surface of the semiconductor substrate 505. Each fin structure 514-516 includes a first sidewall 514A and a second sidewall 514B, where the second sidewall 514B is opposite of the first sidewall 514A. The first sidewall 514A of each fin structure 514-516 is adjacent to a region (e.g., 521, 522, 523, or 524) of the top surface of the semiconductor substrate 505 and the second sidewall 514B of the fin structure is adjacent to a region (e.g., 521, 522, 523, or 524) of the top surface of the semiconductor substrate 505.

Fin height $H_{fin}$ can be referred to as a sidewall height and measured from a top surface of the semiconductor substrate 505 to a top of a fin structure. In one or more implementations, the cross-section of the fin is rectangular and the first sidewall height and the second sidewall height are designed to be similar in value or equal to each other. In one or more implementations, the cross-section of the fin is substantially rectangular, trapezoidal, or other suitable quadrilateral shapes. In one or more implementations, the cross-section of the fin can be triangular. In one or more implementations, the fin structures 514-516 and regions (e.g., 521, 522, 523, or 524) of the semiconductor substrate 505 is doped to form a doped semiconductor substrate 530.

As shown in FIG. 4, an insulation layer (e.g., 545, 550) is disposed above and adjacent to the fin structures 514-516 and regions (e.g., 521, 522, 523, or 524) of the top surface of the semiconductor substrate 505. In one or more implementations, the insulation layer (e.g., 545, 550) includes one or more of a high-k dielectric material 550 and an oxide insulator material 545. A conductor structure (e.g., 555, 560) is formed above and adjacent to the insulation layer (e.g., 545, 550). In one or more implementations, the conductor structure (e.g., 555, 560) includes a work function metal 555 and a gate metal 560. An insulator structure (e.g., 575, 580) is also disposed over and around the conductor structure (e.g., 555, 560) and one or more regions of the top surface of the semiconductor substrate 505.

In one or more implementations, the insulator structure (e.g., 575, 580) includes a first insulator structure 575 having a first type of oxide insulator material and a second insulator structure 580 having a second type of oxide insulator material, where the first and second types may or may not be different. In one or more implementations, the first insulator structure 575 and the second insulator structure 580 are deposited in separate processes. Each of the insulator structures 575 and 580 can be an oxide material (e.g., silicon oxide). In one or more implementations, since the first insulator structure 575 and the second insulator structure 580 are deposited after various junctions are in place, the insulator structures 575 and 580 are generally deposited at lower temperatures relative to previous depositions of oxide materials (e.g., 525, 545). The insulator structures 575 and 580 may have low etch rates (such as low hydrofluoric acid etch rates). In one or more implementations, the conductor structure (e.g., 555, 560) includes at least a first sidewall and a second sidewall (e.g., along the fins 514-516 and along the dielectric material 550), where the insulation layer (e.g., 545, 550) and/or the insulator structure (e.g., 575, 580) is disposed adjacent to the first sidewall and the second sidewall of the conductor structure (e.g., 555, 560).

In accordance with one or more implementations, the finFET device 400 is configured, during operation, to store electrical charge between the conductor structure (e.g., 555, 560) and the fin structures 514-516 so as to provide capacitance. The finFET device 400 is configured to allow the first and second sidewalls 514A and 514B of the fin structures 514-516 as well as the regions 521, 522, 523, and 524 of the top surface of the semiconductor substrate 505 to contribute to the capacitance of the finFET device 400. With reference to FIG. 4, a capacitor with a plurality of plates is formed, in one or more implementations, by the conductor structure (e.g., 555, 560) and the doped semiconductor substrate 530, with the insulation layer (e.g., 545, 550) serving as the dielectric or dielectrics between the plates. The finFET device 400 is configured to allow horizontal regions (e.g., in a direction along the direction of fin width $W_{fin}$) adjacent to the fins 514-516 to contribute to the capacitance. In one or more implementations, a region (e.g., 521, 522, 523, or 524) of the top surface of the semiconductor substrate 505 is a portion of the top surface that abuts the insulation layer (e.g., 545, 550), such as the oxide insulator material 545 of the insulation layer, and that is under the conductor structure (e.g., 555, 560). In one or more implementations, one region (e.g., 521) is separated from another region (e.g., 522) by one or more fin structures (e.g., 514).

FIGS. 5A-5K illustrate a process for forming the finFET device 400 of FIG. 4 in accordance with one or more implementations. As with the process illustrated in FIGS. 3A-3H, it is understood to those skilled in the art that specific order or hierarchy of steps in the process disclosed is an illustration of exemplary approaches and that other processes can be realized to form the finFET device 400 of FIG. 4 in accordance with one or more implementations. Based on preferences and/or specifications (e.g., available resources, performance specifications), it is understood that the specific order or hierarchy of steps in the process may be rearranged or adjusted and that some steps may be removed while others may be added. In any implementation, what is shown as one layer of material (e.g., dielectric layer, metal layer, and so forth) may be realized with multiple layers of materials, where each layer may be of a thickness and/or material different from an adjacent layer.

Figure 5A:
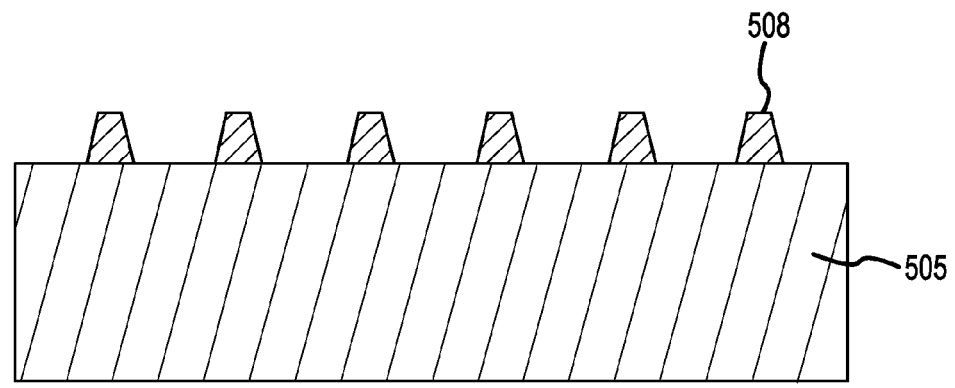
FIGS. 5A-5K illustrate a process for forming the fin-based field effect transistor device of FIG. 4 in accordance with one or more implementations.

In FIG. 5A, a hardmask material is deposited and patterned using semiconductor fabrication techniques to form a plurality of hardmask mandrels 508 on the top surface of the semiconductor substrate 505. In one or more implementations, the patterning is performed using sidewall image transfer (SIT). The hardmask material can be, by way of example and not of limitation, oxide (e.g., silicon oxide) or nitride (e.g., silicon nitride).

Figure 5B:
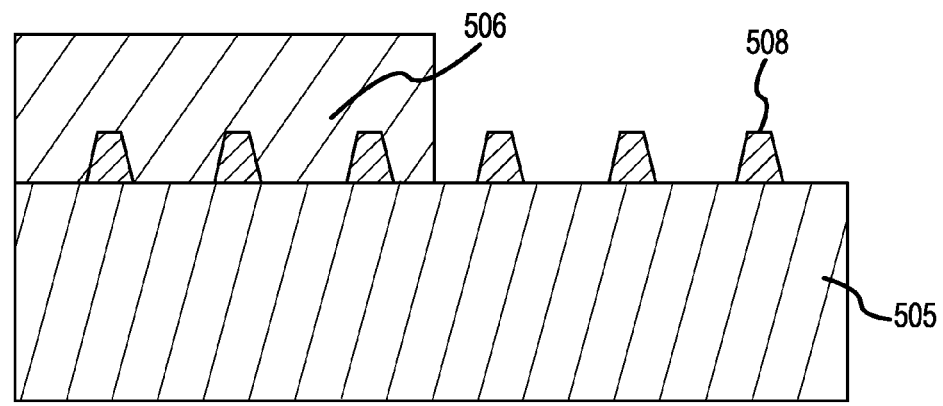

In FIG. 5B, a first resist mask 506 is provided to define regions protected by the first resist mask 506 and regions not protected by the first resist mask 506. In one or more implementations, the first resist mask 506 is a relatively coarse block mask.

Figure 5C:
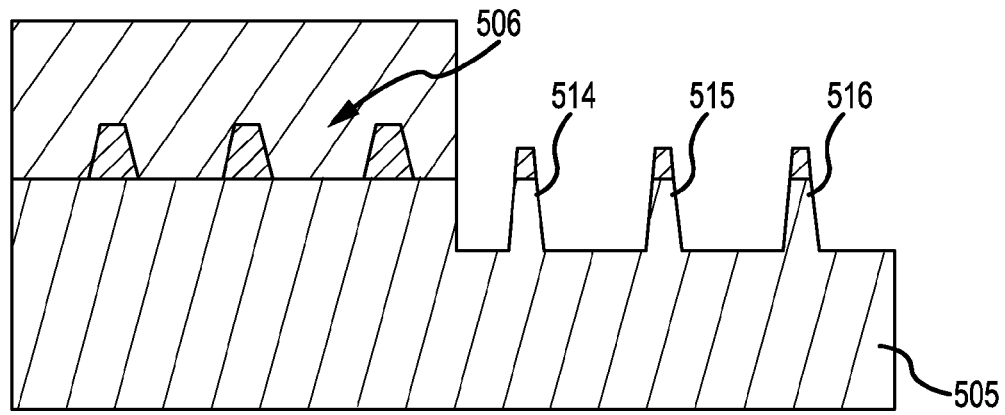

In FIG. 5C, etching is performed on the structure of FIG. 5B to remove regions of the semiconductor substrate 505 based on locations of the first resist mask 506 and the hardmask mandrels 508. Subsequent to the etching, a plurality of fins 514-516 is defined. The first resist mask 506 can be stripped. In one or more implementations, the etch defines passive regions (e.g., regions used to implement passive devices such as capacitors) and non-passive regions or device regions (e.g., regions used to implement transistor devices). As shown in FIG. 5C, the plurality of fins 514-516 can be utilized in realizing MOS capacitors in a passive region. It is understood that, although the removed regions of the semiconductor substrate 505 should ideally remove the semiconductor substrate 505 in the non-protected regions and leave intact the semiconductor substrate 505 in the protected regions, some of the semiconductor substrate 505 may be removed in the protected areas (e.g., from undercutting). In one or more implementations, the plurality of fins 514-516, and thus the semiconductor substrate 505 that is etched to define the plurality of fins 514-516, is composed of silicon material. Other materials such as gallium-arsenide, silicon-germanium, among other suitable substrate materials identifiable by a person skilled in the art may also be utilized in the process, in accordance with one or more implementations.

Figure 5D:
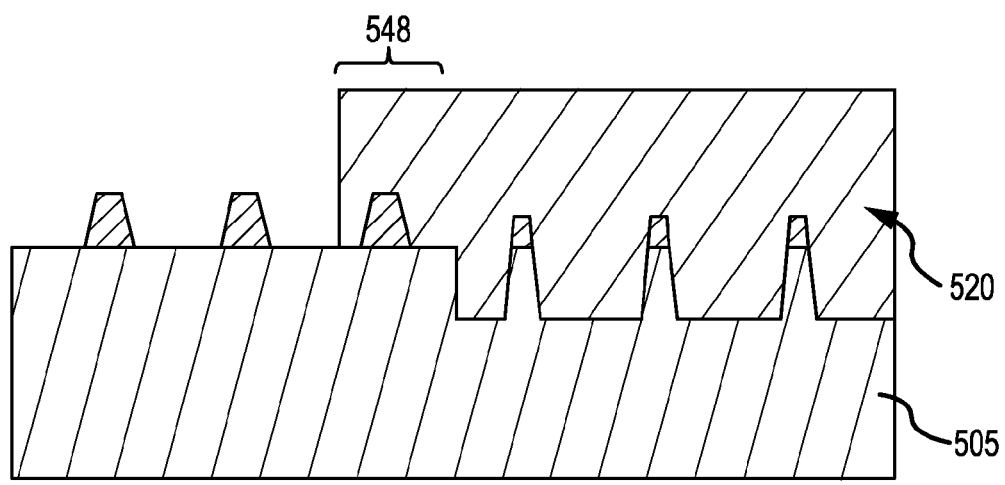

In FIG. 5D, a second resist mask 520 is provided to define regions protected by the second resist mask 520 and regions not protected by the second resist mask 520. In one or more implementations, the second resist mask 520 is utilized to protect at least the passive regions. In one or more implementations, a region 548 adjacent to the passive region can also be protected, as shown in FIG. 5D.

Figure 5E:
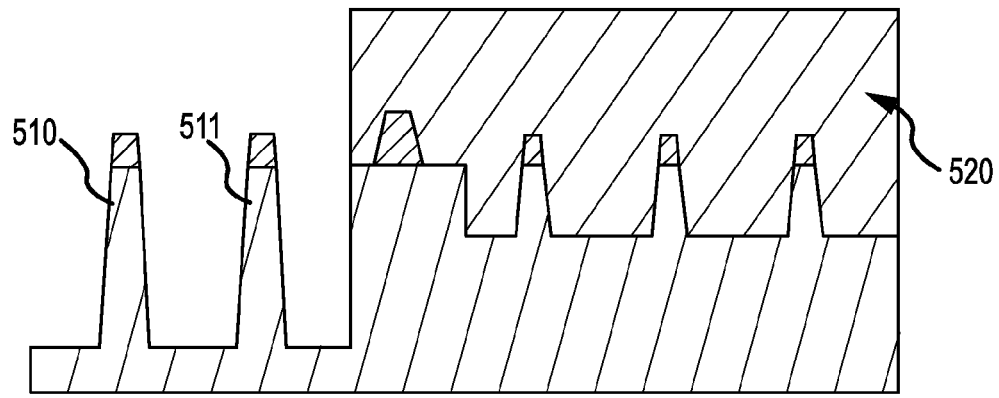

In FIG. 5E, etching is performed on the structure of FIG. 5D to remove regions of the semiconductor substrate 505 based on locations of the second resist mask 520 and the hardmask mandrels 508. Subsequent to the etching, a plurality of fins 510-511 is defined. The second resist mask 520 can be stripped. In one or more implementations, the etch performed as illustrated in FIG. 5E is a deeper etch than the etch performed as illustrated in FIG. 5C, such that fin heights of fins in the plurality of fins 510-511 is larger than fin heights of fins in the plurality of fins 514-516. In one or more implementations, the top surface of the semiconductor substrate 505 is at different heights in different regions.

Figure 5F:
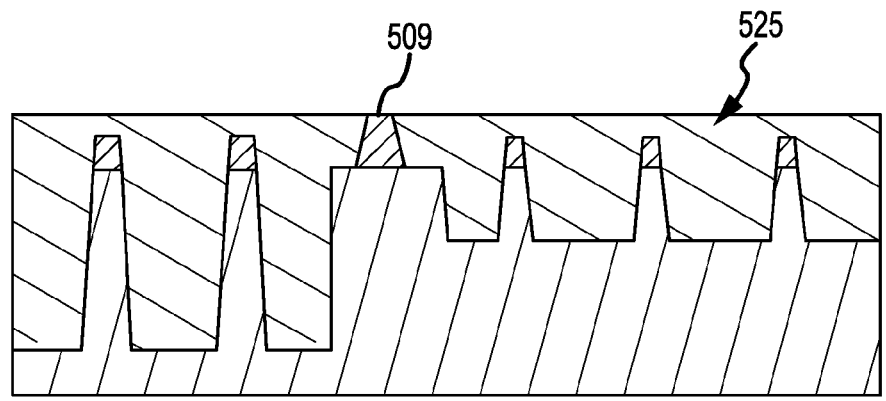

In FIG. 5F, an oxide material 525 is deposited over the structure of FIG. 5E. In one or more implementations, the oxide material 525 is an oxide suitable for filling the trenches between the fins. The oxide material 525 may also have a low etch rate (such as a low hydrofluoric acid etch rate). Silicon dioxide ($SiO_2$) is generally used as the oxide material 525, although other suitable oxides can be used. In one or more implementations, the oxide material 525 can be deposited utilizing a process such as a chemical vapor deposition (CVD), low pressure chemical vapor deposition (LPCVD), molecular layer deposition (MLD), among others. In one or more implementations, the oxide material 525 is grown as part of a shallow trench isolation (STI) process. In one or more implementations, thickness of the oxide material 525 is based on the locations of the hardmask mandrels 508. As shown in FIG. 5F, the oxide material 525 is deposited such that the oxide material 525 covers a top-most hardmask mandrel 509.

Figure 5G:
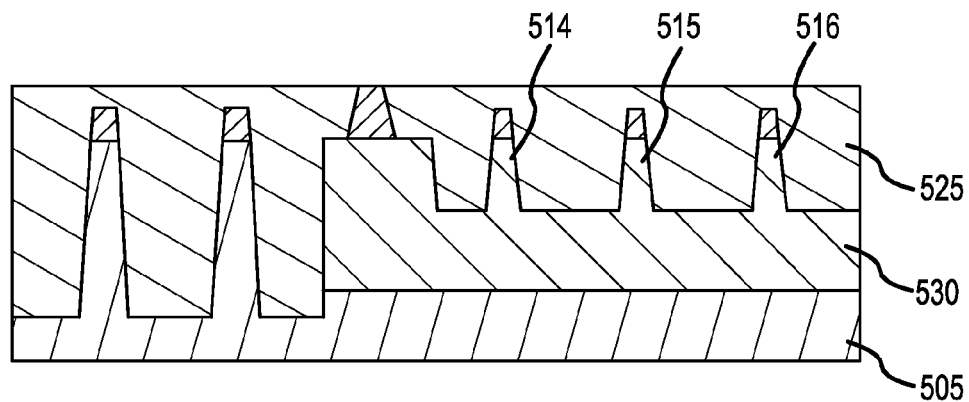

In FIG. 5G, doping is performed to implant dopants into the passive region. Specifically, portions of semiconductor substrate 505 beneath the top surface and the fins 514-516 are doped, which is shown as a doped semiconductor substrate 530. The doping may be performed using multiple doping processes. The doping can be n-type doping or p-type doping. In any implementation, a uniform implant may be utilized to ensure the semiconductor substrate 505 in the passive regions is uniformly doped to ensure good access resistance when metal contacts/plates are contacted with the finFET device 400 to form MOS capacitors. It is noted that, although not shown in FIG. 5G, doping can also be performed in regions outside of the passive region, where the doping can be, but need not be, different from the doping performed in the passive region. In one or more implementations, the doping may be performed using ion implantation. In one or more implementations, the doping may utilize an in-situ conformal doping source (e.g., material is doped when grown) such as a doped oxide.

Figure 5H:
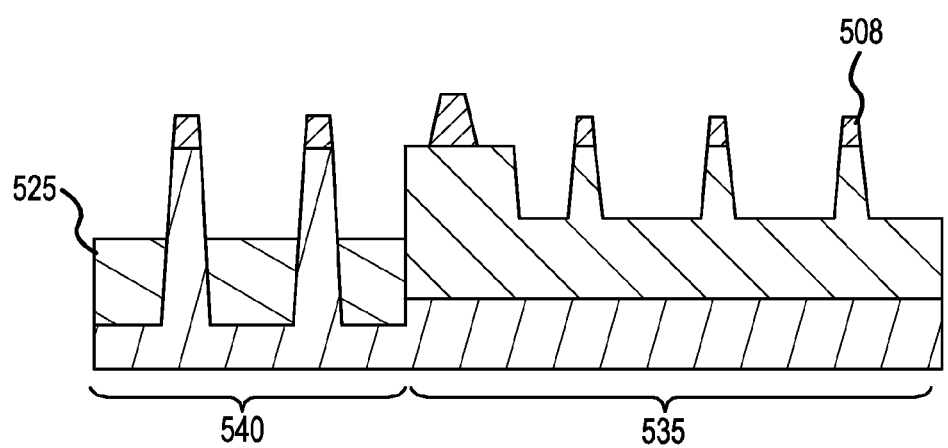

In FIG. 5H, the oxide material 525 is removed such that the oxide material 525 in a region 535, which is associated with a passive region, is removed whereas a layer of the oxide material 525 is intact on and adjacent to the semiconductor substrate 505 surface in a region 540. In one or more implementations, thickness of the oxide material 525 in the region 540 can be between 30 nanometers and 80 nanometers. In one example, the thickness is between 50 nanometers and 60 nanometers. In one or more implementations, the fin heights of fins in the plurality of fins 514-516 are chosen such that subsequent to removing the oxide material 525, the region 535 is exposed (e.g., devoid or substantially devoid of a layer of oxide material on the semiconductor substrate 505 surface). It is understood that, in one or more implementations, implantation/doping can be performed subsequent to removal of the oxide material 525 as opposed to prior to the removal.

Figure 5I:
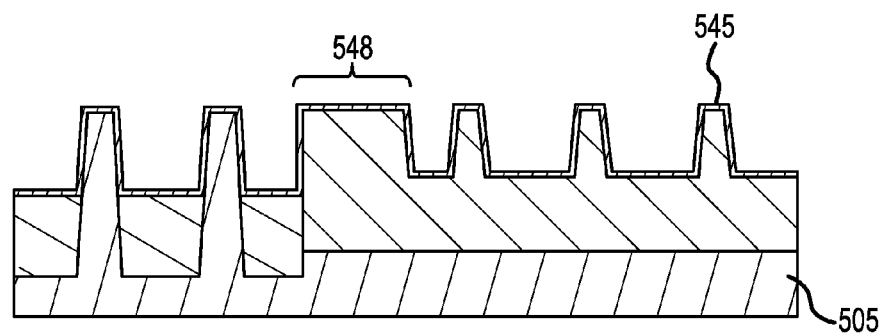

In FIG. 5I, a hardmask removal is performed to remove the hardmask mandrels 508 and a second oxide material 545 is deposited over the resulting structure. It is noted that the resulting structure includes a raised region 548 of the top surface of the semiconductor substrate 505 that can be considered as adjacent to or part of the passive region. The raised region 548 can be configured, in one or more implementations, to accept a metal contact.

In one or more implementations, the second oxide material 545 is disposed as a conformal layer above and adjacent to the fin structures 514-516 and regions of the top surface of the semiconductor substrate 505. In one or more implementations, the second oxide material 545 is also disposed as a conformal layer above and adjacent to portions of the fin structures 510-511. The second oxide material 545 can be a dielectric material such as silicon dioxide ($SiO_2$). Another example material for the second oxide material 545 is a nitrided silicon oxide (e.g., SiON). Other suitable materials may also be used. The second oxide material 545 can have a thickness in a range between 0.5 and 5.0 nanometers. In one or more implementations, the second oxide material 545 can be deposited utilizing a molecular vapor deposition (MVD) process, although other suitable deposition processes may be utilized.

The second oxide material 545 can be formed using a thick gate oxide (e.g., 3.0 nanometers) deposition or growth, corresponding to a high operating voltage process (e.g., 3.6 VDC). Alternatively, the second oxide material 545 can be formed using a thin gate oxide (e.g., 0.5 nanometers) deposition or growth, corresponding to a low operating voltage process (e.g., 1.8 VDC). The thin gate oxide can be grown, for example, using thermal oxidation. The thick gate oxide increases the breakdown voltage of the finFET device 400 of FIG. 4 when compared to the thin gate oxide of the low operating voltage process.

Figure 5J:
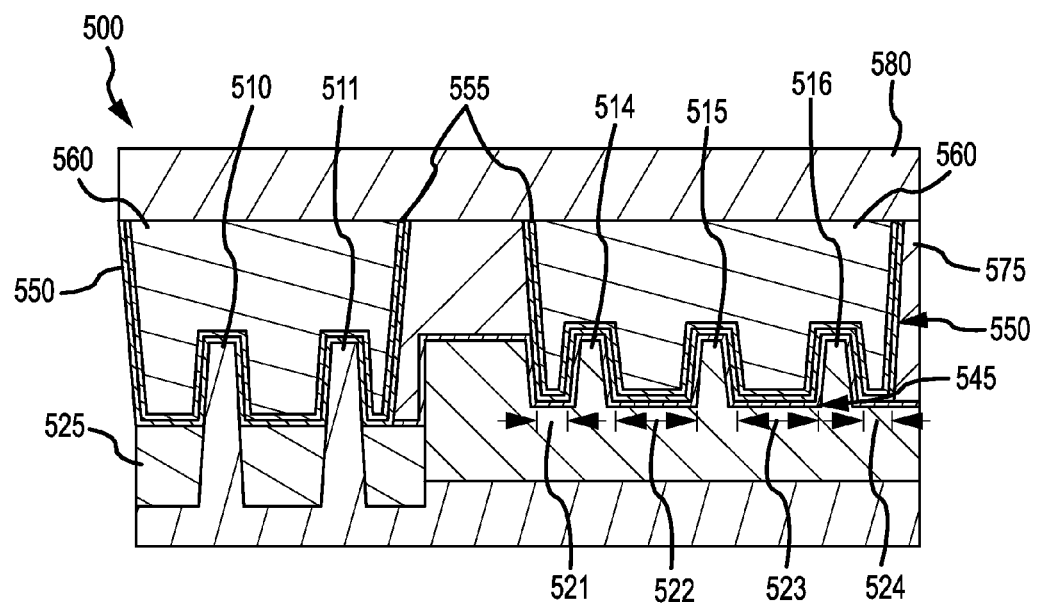

In FIG. 5J, a dielectric material 550, a work function metal 555, and a gate metal 560 are disposed on the oxide material 545. An insulation layer (e.g., 545, 550) can be formed by the oxide material 545 and the dielectric material 550. A conductor structure (e.g., 555, 560) can be formed by the work function metal 555 and the gate metal 560. An insulator structure (e.g., 575, 580) is also disposed over and around the conductor structure (e.g., 555, 560) and the insulation layer (e.g. 545, 550). In one or more implementations, the insulator structure (e.g., 575, 580) includes a first insulator structure 575 having a first type of oxide insulator material and a second insulator structure 580 having a second type of oxide insulator material, where the first and second types may or may not be different. In one or more implementations, the oxide material 545 is under and adjacent to the dielectric material 550 in the device region. It is understood that a dummy polysilicon deposition and a gate etch generally performed are not explicitly shown.

Specifically, FIG. 5J illustrates a cross-sectional view of a semiconductor device 500, which can be itself considered a finFET device, that includes a passive region (e.g., capacitor region) with fins 514-516 and a device region (e.g., transistor region) with fins 510-511 according to one or more implementations. The semiconductor device 500 includes the finFET device 400 shown in FIG. 4 prior to providing metal contacts. In one or more implementations, the semiconductor device 500 is configured to accept metal contacts at source, drain, and gate terminals corresponding to each finFET device that forms the semiconductor device 500, similar to what is shown FIG. 2B.

In one or more implementations, the dielectric material 550 is thinner than the work function metal 555. In one or more implementations, the dielectric material 550 is a high-k dielectric material. A higher dielectric constant k allows for a thicker layer of dielectric material 550 to be utilized (e.g., for tunneling considerations). The high-k dielectric material 550 can include, but is not limited to, hafnium oxide, hafnium silicon oxide, lanthanum oxide, lanthanum aluminum oxide, yttrium oxide, lead zinc niobate, among other high-k dielectric materials identifiable by a person skilled in the art. In one or more implementations, the work function metal 555 can include, but is not limited to, titanium carbide, titanium aluminide, tantalum nitride, titanium nitride, tungsten nitride, iridium dioxide, among other metals identifiable by a person skilled in the art. The work function metal 555 can be doped. In one or more implementations, the work function metal 555 can be part of the gate metal 560 and not a separate layer of metal.

In any implementation, the dielectric material 550 can include more than one layer of dielectric material, with each dielectric layer being of a different dielectric from an adjacent dielectric layer. Any dielectric layer can be of a thickness equal to or different from an adjacent dielectric layer. In one or more implementations, the work function metal 555 can include more than one layer of metal, with each metal layer being of a different metal from an adjacent metal layer. Any metal layer can be of a thickness equal to or different from an adjacent metal layer.

Figure 5K:
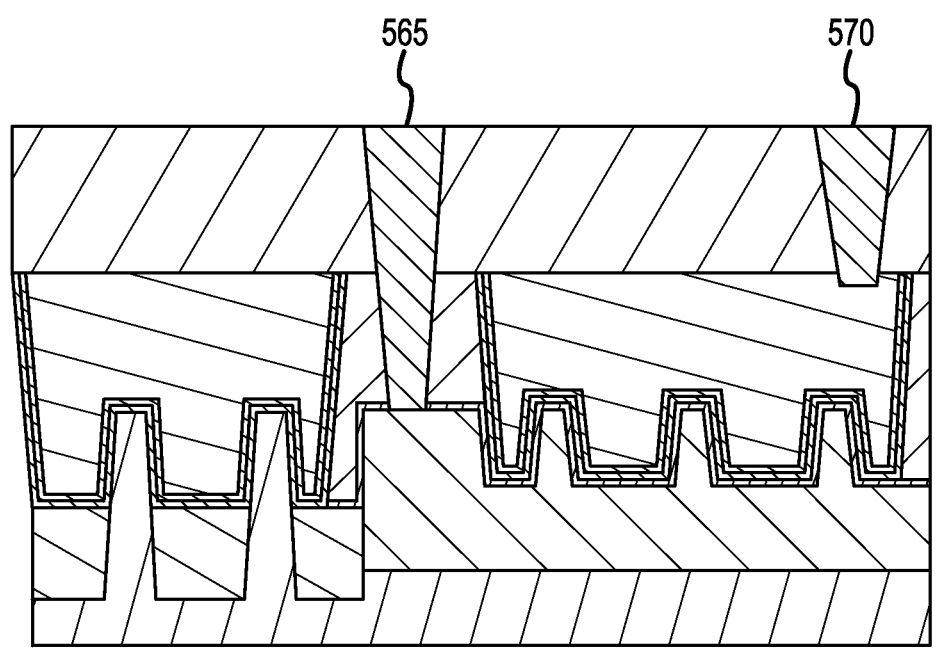

In FIG. 5K, metal contacts 565 and 570 connected to the finFET device 400. The diffusion metal contact 565 is connected to the raised region 548 between the passive region and the device region, whereas the metal contact 570 is connected to the gate metal 560 of the passive region. In one or more configurations, the metal contacts 565 and 570 can be provided as a middle-of-the-line (MOL) contact module. In one or more configurations, the metal contacts 565 and 570 can form a first and a second plate of a capacitor, and the finFET device 400 of FIG. 4, shown as part of the semiconductor device 500 of FIG. 5, can be configured as a MOS capacitor.

In one or more implementations, the finFET device 400 can be connected with metal contacts in a configuration similar to that shown with reference to FIG. 2B. In one or more implementations, the finFET device 200 of FIG. 2A can be connected with metal contacts in a configuration similar to that shown with reference to FIG. 5K.

As previously indicated, the active sidewall height refers to a height of the fin that contributes to capacitance whereas the full sidewall height, denoted as $H_{fin}$, refers to a physical height of the fin as measured starting from a top surface of a semiconductor substrate to a top of the fin. Consequently, the active sidewall height includes a height along the full sidewall height that contributes to capacitance. The remaining height along the full sidewall height can be referred to as a non-active sidewall height, which includes a height along the full sidewall height that does not contribute to capacitance or only contributes negligibly to capacitance (e.g., parasitic capacitance). Compared to the device region, portions of the top surface of the semiconductor substrate 505 between the fin structures 514-516 of the capacitor region act as active regions of the semiconductor device 500 of FIG. 5J, and hence increase the amount of surface area that contributes to the capacitance of the capacitor region. For example, the foregoing portions of the top surface of the semiconductor substrate 505 may include regions such as regions 521, 522, 523, and 524. In one or more implementations, the non-active sidewall heights of a fin have an associated capacitance density less than 1% of an associated capacitance density in the active sidewall heights of the fin.

In one or more implementations, the active sidewall height of the fins in the passive region is less than or equal to the active sidewall height of the fins in the device region. In one or more implementations, as shown for example in FIG. 5J, a ratio of active sidewall height to full sidewall height of the fins in the passive region is higher than the corresponding ratio of the fins in the device region.

In accordance with one or more implementations, the insulation layer in the device region includes the layer of the oxide material 525 disposed on and adjacent to portions of the fin structures 510-511 and the high-k dielectric material 550 disposed on the layer of oxide material 525. In one or more implementations, the insulation layer in the device region also includes a layer of the oxide material 545 disposed on and adjacent to the layer of the oxide material 525 and portions of the fin structures 510-511. The conductor structure (e.g., 555, 560), which in one or more implementations includes a work function metal 555 and a gate metal 560, is disposed on and adjacent to the high-k dielectric material 550. In one or more implementations, the layer of the oxide material 525 surrounds the non-active sidewall height of the fins 510-511 and the high-k dielectric material 550 surrounds the active sidewall height of the fins 510-511. Alternatively, in one or more implementations, the layer of the oxide material 525 surrounds the non-active sidewall height of the fins 510-511 and the layer of the oxide material 545 surrounds the active sidewall height of the fins 510-511.

In one or more implementations, the insulation layer (e.g., 545, 550) in the passive region includes a layer of the oxide material 545 and the high-k dielectric material 550 disposed on and adjacent to the layer of the oxide material 545. The conductor structure (e.g., 555, 560), which in one or more implementations includes a work function metal 555 and a gate metal 560, is disposed on the high-k dielectric material 550. In one or more implementations, the layer of the oxide material 545 surrounds the active sidewall height of the fins 514-516. In one or more implementations, the insulation layer in the device region is thicker than the insulation layer in the passive region.

As an example, the layer of the oxide material 545 can have a thickness between 0.5 nanometers and 5.0 nanometers. The high-k dielectric material 550 can have a thickness between 1.0 nanometer and 3.0 nanometers. Accordingly, in one or more implementations, thickness of the insulation layer can be between 1.5 nanometers and 8.0 nanometers. In one or more implementations, the insulation layer can include more than one layer of oxide material and/or more than one layer of high-k dielectric material, where thickness of the insulation layer can be between 1.5 nanometers and 8.0 nanometers.

In one or more implementations, the fin structures 510-511 and 514-516 are rectangular with a fin thickness/width of 10 nanometers; a distance (e.g., horizontal distance in FIG. 5K) between adjacent fin structures, referred to as a fin pitch, is 48 nanometers; the active sidewall height and full sidewall height of the fin structures 510-511 are 30 nanometers and 90 nanometers, respectively; and the active sidewall height and full sidewall height of the fin structures 514-516 are both 30 nanometers. In this example, the perimeter for a fin in the passive region has an additional 38 nanometers relative to a fin in the device region with which to contribute capacitance. Consequently, in one or more implementations, the passive region of the semiconductor device 500 allows for a larger perimeter (and larger surface area) with which to contribute to capacitance. For example, based on these perimeter values and assuming other characteristics are equal, capacitance density of a fin in the passive region can be configured to have a 50% increase in capacitance density over a fin in the device region.

In any implementation, fin dimensions (e.g., fin width and/or fin height) and fin spacing between the fin structures need not be the same between any two adjacent or non-adjacent fin structures. In one or more implementations, the full sidewall height of a fin structure can be in a range between 10 nanometers and 90 nanometers. A shorter fin in any implementation (e.g., the fin structures 514-516) can be in a range between 10 nanometers and 60 nanometers, such as 30 nanometers. A longer fin in any implementation (e.g., the fin structures 510-511) can be 90 nanometers. The dimensions provided are examples only and other dimensions can be utilized in accordance with one or more implementations. In any implementation, number of fin structures in each region can be different from each other and can be different from that depicted in the figures.

It is understood to those skilled in the art that specific order or hierarchy of steps in the FIGS. 5A-5K is an illustration of exemplary approaches and that other processes can be realized to form the finFET device 400 of FIGS. 5A-5K in accordance with one or more implementations. Based on preferences and/or specifications (e.g., available resources, performance specifications), it is understood that the specific order or hierarchy of steps in the process may be rearranged or adjusted and that some steps may be removed while others may be added. In any implementation, what is shown as one layer of material (e.g., dielectric layer, metal layer, and so forth) may be realized with multiple layers of materials, where each layer may be of a thickness and/or material different from an adjacent layer.

For example, in any implementation, as an alternative to that shown in FIGS. 5B-5E, fewer or additional masking and etching can be utilized to define protected regions and the fins. Instead of defining only the fins 514-516 in FIG. 5C, a shallower etch can be performed to define the fins 510-511 and 514-516. The fins 514-516 can then be protected by a mask, after which a further etch can be performed to achieve higher full sidewall height for the fins 510-511. Other combinations of masking and etching identifiable by a person skilled in the art are possible.

It is noted that dimensional aspects (e.g., oxide thickness, fin height) provided above are examples and that other values for the dimensions can be utilized in accordance with one or more implementations. Furthermore, the dimensional aspects provided above are generally nominal values. As would be appreciated by a person skilled in the art, each dimensional aspect, such as an oxide thickness, has a tolerance associated with the dimensional aspect. For example, in terms of an oxide thickness, the tolerance can be a function of the process utilized in depositing or growing the oxide.

As used herein, the "gate" refers to an insulated gate terminal of a FET. The physical structure of the gate terminal is referred to as a gate electrode. "Source/drain (S/D) terminals" refer to the terminals of a FET between which conduction occurs under the influence of an electric field subsequent to inversion of the semiconductor surface under the influence of an electric field resulting from a voltage applied to the gate terminal of the FET. Generally, the source and drain terminals of a FET are fabricated such that the source and drain terminals are geometrically symmetrical. With geometrically symmetrical source and drain terminals, these terminals can be simply referred to as source/drain terminals. Designers often designate a particular source/ drain terminal to be a "source" or a "drain" on the basis of the voltage to be applied to that terminal when the FET is operated in a circuit.

As used herein, the terms "contact" and "via" both refer to structures in a chip used for electrical connection of conductors from different interconnect levels of the chip. These terms can describe both an opening in an insulator in which the structure will be completed as well as the completed structure itself. For purposes of this disclosure, both contact and via refer to the completed structure.

As used herein, the term "substrate" refers to the physical object that is the basic workpiece transformed by various process operations into the desired microelectronic configuration. A typical substrate used for the manufacture of integrated circuits is a wafer. Wafers may be made of semiconducting (e.g., bulk silicon), non-semiconducting (e.g., glass), or combinations of semiconducting and non-semiconducting materials (e.g., silicon-on-insulator (SOI)). In the semiconductor industry, a bulk silicon wafer is commonly used for the manufacture of integrated circuits.

In the semiconductor industry environment of foundries and fabless companies, the foundries develop, specify, and provide the physical structures that designers use to implement their designs. Foundries provide manufacturing services to many fabless semiconductor companies, but to operate profitably they optimize their manufacturing processes to achieve high yields. Such optimizations generally require that limitations be placed on the variety of structures that can be produced by a particular manufacturing process. Consistent with the foregoing, foundries typically provide a limited set of transistor structures that are intended to cover a broad range of circuit applications.

One or more implementations are performed by one or more integrated circuits, such as application specific integrated circuits (ASICs) or field programmable gate arrays (FPGAs). In one or more implementations, such integrated circuits execute instructions that are stored on the circuit itself. The term "integrated circuit" or "semiconductor device" may include, but is not limited to, a design tool output file as binary code encompassing the overall physical design of the integrated circuit or semiconductor device, a data file encoded with code representing the overall physical design of the integrated circuit or semiconductor device, a packaged integrated circuit or semiconductor device, or an unpackaged die. The data file can include elements of the integrated circuit or semiconductor device, interconnections of those elements, and timing characteristics of those elements (including parasitics of the elements).

The predicate words "configured to" and "operable to" do not imply any particular tangible or intangible modification of a subject, but, rather, are intended to be used interchangeably. Terms such as "top", "bottom", "front", "rear", "side", "horizontal", "vertical", and the like refer to an arbitrary frame of reference, rather than to the ordinary gravitational frame of reference. Thus, such a term may extend upwardly, downwardly, diagonally, or horizontally in a gravitational frame of reference.

Phrases such as an aspect, the aspect, another aspect, some aspects, one or more aspects, an implementation, the implementation, another implementation, some implementations, one or more implementations, an embodiment, the embodiment, another embodiment, some embodiments, one or more embodiments, a configuration, the configuration, another configuration, some configurations, one or more configurations, the subject technology, the disclosure, the present disclosure, other variations thereof and alike are for convenience and do not imply that a disclosure relating to such phrase(s) is essential to the subject technology or that such disclosure applies to all configurations of the subject technology. A disclosure relating to such phrase(s) may apply to all configurations, or one or more configurations. A disclosure relating to such phrase(s) may provide one or more examples. A phrase such as an aspect may refer to one or more aspects and vice versa, and this applies similarly to other phrases.

Any implementation described herein as an "example" is not necessarily to be construed as preferred or advantageous over other implementations. Furthermore, to the extent that the term "include", "have", or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for".

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more". Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. A semiconductor device, comprising:
   a semiconductor substrate;
   a first fin structure disposed on a first region of a top surface of the semiconductor substrate;
   a second fin structure disposed on a second region of the top surface of the semiconductor substrate;
   an isolation layer disposed on the second region of the top surface of the semiconductor substrate and adjacent to sidewalls of the second fin structure;
   a first insulation layer disposed on the first fin structure, the first insulation layer comprising one or more dielectric layers;
   a second insulation layer disposed on the second fin structure and the isolation layer;

a first conductor structure disposed on the first insulation layer, the first conductor structure having at least one sidewall in contact with a sidewall of the first fin structure and the top surface of the semiconductor substrate via the one or more dielectric layers of the first insulation layer; and a second conductor structure disposed on the second insulation layer, the second conductor structure having at least one sidewall in contact with at least one sidewall of the second fin structure and a top surface of the isolation layer via the second insulation layer.

2. The semiconductor device of claim 1, wherein the semiconductor device is configured to:

store electrical charge between the first conductor structure and the first fin structure to provide a first capacitance and store electrical charge between the second conductor structure and the second fin structure to provide a second capacitance; and allow an active sidewall height of the first fin structure to contribute to the first capacitance and allow an active sidewall height of the second fin structure to contribute to the second capacitance.

3. The semiconductor device of claim 1, wherein the isolation layer is thicker than the first insulation layer and the second insulation layer.

4. The semiconductor device of claim 2, wherein the active sidewall height of the second fin structure is less than or equal to the active sidewall height of the first fin structure.

5. The semiconductor device of claim 2, further comprising:

a second plurality of fin structures, the second fin structure being one of the fin structures in the second plurality of fin structures, wherein a distance along the second region of the top surface of the semiconductor substrate between adjacent fin structures in the second plurality of fin structures contributes to the second capacitance.

6. The semiconductor device of claim 5, further comprising:

a first plurality of fin structures, the first fin structure being one of the fin structures in the first plurality of fin structures, wherein a full sidewall height of at least one of the second plurality of fin structures is larger than a full sidewall height of at least one of the first plurality of fin structures.

7. The semiconductor device of claim 1, further comprising a raised region of the top surface of the semiconductor substrate adjacent to the second region.

8. The semiconductor device of claim 7, wherein the raised region of the top surface of the semiconductor substrate is adjacent to the first region.

9. The semiconductor device of claim 7, wherein the second insulation layer comprises an oxide insulation material and the oxide insulation material is disposed adjacent to the raised region.

10. The semiconductor device of claim 9, wherein the oxide insulation material has a thickness in a range between 0.5 and 5.0 nanometers.

11. The semiconductor device of claim 1, wherein the second insulation layer comprises an oxide insulation material having a thickness in a range between 0.5 and 5.0 nanometers.

12. A semiconductor device, comprising:
a semiconductor substrate;
a plurality of fin structures;
a first insulation layer disposed on at least one of the plurality of fin structures in a first region of the semiconductor substrate, the first insulation layer comprising one or more dielectric layers;
an isolation layer disposed on a second region of the semiconductor substrate and in contact with sidewalls of at least one of the plurality of fin structures, the second region being different from the first region;
a second insulation layer disposed on the at least one of the plurality of fin structures in the second region and on the isolation layer;
a first conductor structure disposed on the first insulation layer, the first conductor structure having at least one sidewall in contact with a sidewall of the at least one of the plurality of fin structures in the first region and a top surface of the semiconductor substrate via the one or more dielectric layers of the first insulation layer; and
a second conductor structure disposed on the second insulation layer, the second conductor structure having at least one sidewall in contact with at least one sidewall of the at least one of the plurality of fin structures in the second region and a top surface of the isolation layer via the second insulation layer.

13. The semiconductor device of claim 12, further comprising an insulator structure disposed over and around the first conductor structure and above one or more regions of the top surface of the semiconductor substrate.

14. The semiconductor device of claim 13, wherein the insulator structure comprises a first insulator structure having a first type of oxide insulator material and a second insulator structure having a second type of oxide insulator material, the second insulator structure being disposed above and adjacent to the first insulator structure and the first conductor structure.

15. The semiconductor device of claim 13, wherein:
the first conductor structure comprises a first sidewall and a second sidewall, and
the insulator structure is disposed adjacent to the first sidewall and the second sidewall of the first conductor structure.

16. The semiconductor device of claim 12, wherein:
the first conductor structure comprises a first sidewall and a second sidewall, and
the first insulation layer is disposed adjacent to the first sidewall and the second sidewall of the first conductor structure.

17. The semiconductor device of claim 12, further comprising a raised region of the top surface of the semiconductor substrate, the raised region being located between the first region and the second region.

18. The semiconductor device of claim 17, wherein the raised region is in contact with a sidewall of the first insulation layer.

19. The semiconductor device of claim 12, wherein the first insulation layer comprises an oxide insulator material having a thickness in a range between 0.5 and 5.0 nanometers.

20. The semiconductor device of claim 12, wherein the first insulation layer comprises one or more of a high-k dielectric material and an oxide insulator material.

* * * * *